US007889878B2

(12) United States Patent
Takumai

(10) Patent No.: US 7,889,878 B2
(45) Date of Patent: Feb. 15, 2011

(54) SPEAKER ARRAY APPARATUS AND METHOD FOR SETTING AUDIO BEAMS OF SPEAKER ARRAY APPARATUS

(75) Inventor: Susumu Takumai, Hamamatsu (JP)

(73) Assignee: Yamaha Corporation (JP)

( * ) Notice: Subject to any disclaimer, the term of this patent is extended or adjusted under 35 U.S.C. 154(b) by 763 days.

(21) Appl. No.: 10/597,407

(22) PCT Filed: Jun. 21, 2005

(86) PCT No.: PCT/JP2005/011345

§ 371 (c)(1),
(2), (4) Date: Jul. 24, 2006

(87) PCT Pub. No.: WO2006/001272

PCT Pub. Date: Jan. 5, 2006

(65) Prior Publication Data

US 2008/0165979 A1 Jul. 10, 2008

(30) Foreign Application Priority Data

Jun. 23, 2004 (JP) ............................ 2004-185364

(51) Int. Cl.
*H04R 5/02* (2006.01)
*H04R 29/00* (2006.01)
*H04R 3/00* (2006.01)
*H03G 9/00* (2006.01)

(52) U.S. Cl. ...................... 381/303; 381/300; 381/304; 381/305; 381/56; 381/307; 381/59; 381/92; 381/102; 381/302

(58) Field of Classification Search ......... 381/303–310, 381/56–59, 1, 17–19, 102, 92
See application file for complete search history.

(56) References Cited

U.S. PATENT DOCUMENTS 7,577,260 B1 8/2009 Hooley et al.
2003/0185404 A1 10/2003 Milsap
2006/0153391 A1 * 7/2006 Hooley et al. ................ 381/17

FOREIGN PATENT DOCUMENTS

JP 2003-510924 A 3/2003

(Continued)

OTHER PUBLICATIONS

Supplementary European Search Report issused in corresponding European Patent Application No. 05753349.9 dated Dec. 2, 2009.
Relevant Portion of International Search Report of corresponding PCT Application PCT/JP2005/011345.

*Primary Examiner*—Devona E Faulk
(74) *Attorney, Agent, or Firm*—Rossi, Kimms & McDowell LLP

(57) ABSTRACT

To provide a speaker array apparatus and a method for setting audio beams in a speaker array apparatus, in which the degree of freedom in the place where the speaker array apparatus is installed is high, and a user can set audio beams easily. A speaker array apparatus 1 sweeps a range of from 0 degree to 180 degrees in front of a speaker array 10 with audio beams based on an audio signal limited to a band where the angles of the audio beams can be adjusted. The speaker array apparatus 1 collects direct sounds or reflected sounds of the audio beams through a nondirectional microphone 2. The speaker array apparatus 1 analyzes the collected audio data, detects peaks not lower than a threshold value, and checks symmetry among the peaks. When there is a symmetry, the angles where the peaks were detected are set as angles with which audio beams of respective channels of a surround-sound should be output. Thus, outgoing angles of the audio beams can be set in optimum positions in accordance with the shape of a room or the installation position where the speaker array apparatus is installed.

6 Claims, 13 Drawing Sheets

FOREIGN PATENT DOCUMENTS

| | | | | |
|---|---|---|---|---|
| JP | 2003-299180 | A | | 10/2003 |
| JP | 2003299180 | A | * | 10/2003 |
| JP | 2005-064746 | A | | 3/2005 |
| JP | 2005064746 | A | * | 3/2005 |
| WO | 01/23104 | A2 | | 4/2001 |
| WO | 01/23104 | A2 | | 5/2001 |

* cited by examiner

SPEAKER ARRAY APPARATUS AND METHOD FOR SETTING AUDIO BEAMS OF SPEAKER ARRAY APPARATUS

This is a U.S. National Phase Application of PCT International Application PCT/JP2005/011345 filed on Jun. 21, 2005.

TECHNICAL FIELD

The present invention relates to a speaker array apparatus for outputting a plurality of audio beams to reproduce a surround-sound, and particularly relates to a speaker array apparatus having a high degree of freedom as to an installation location thereof so that the audio beams can be set easily.

BACKGROUND ART

In the background art, there has been a proposed a technique in which a plurality of audio beams are formed by use of a speaker array constituted by a plurality of speakers disposed in a matrix, so that propagation directivities of the audio signals are controlled (for example, see Patent Document 1). By use of this technique, it is not necessary to install a plurality of speakers around a user (listener) as in a background-art surround-sound system, but it is possible to output a plurality of audio beams from one panel-like speaker array so as to reproduce a surround-sound.

FIG. 12 is a top perspective view of a room where a speaker apparatus disclosed in Patent Document 1 is installed. FIG. 12 shows an example of a speaker apparatus with a speaker array constituting a 5.1ch surround-sound system. Here, in the following description, in the 5.1ch surround-sound system, term a front left channel L(Left)ch, a front right channel R(Right)ch, a center channel C(Center)ch, a rear left channel SL(Surround Left)ch, a rear right channel SR(Surround Right)ch, and a subwoofer LFE(Low Frequency Effects)ch.

A speaker apparatus 213 shown in FIG. 12 has several hundreds of speaker units disposed in a predetermined array in one panel. The speaker apparatus 213 adjusts the timing when a surround-sound is output from each speaker unit in each channel, so as to emit the surround-sound like beams. The speaker apparatus 213 delays and controls the audio beams so that the audio beams have a focus on a desired point in the space. The sound of each channel is reflected by the ceiling or wall so as to create a sound source toward the wall. Thus, a multi-channel sound field is reproduced. As shown in FIG. 12, the speaker apparatus 213 disposed under a video apparatus 212 installed near a central portion of a room wall 220 and in front of a user U outputs sounds like a center speaker (C) and a bass compensating subwoofer (LEF) directly to the user. In addition, the speaker apparatus 213 makes walls 221 and 222 on the left and right sides of the user U reflect audio beams so as to create a virtual Rch speaker 214 and a virtual Lch speaker 215. Further, the speaker apparatus 213 makes the walls 221 and 222 on the left and right sides of the user and a wall 223 at the rear of the user U reflect audio beams so as to create a virtual SRch speaker 216 and a virtual SLch speaker 217 on the rear left and right sides of the user U. In such a manner, in the surround-sound system using a speaker array, audio signals from respective channels are delayed and controlled to be formed into beams, and these sounds formed into the beams are reflected by the walls so as to create a plurality of sound sources. Thus, a sense of surround-sound can be obtained as if a plurality of speakers were installed around the user U.

Patent Document 1: JP-T-2003-510924

When the background-art speaker array apparatus is installed, information about the listening position of the user and the width, depth and height of the room as information about the shape of the installation environment are given to the speaker array apparatus. Thus, angles of audio beams are automatically calculated so that the audio beams are set. When such a setting function is not provided in the speaker array apparatus, a specialist adjusts the angles of audio beams manually while listening to a reproduced sound from the speaker array apparatus in the listening position.

In the case of the former method, however, there is a problem that there is a limitation in the shape and installation place of the room where the speaker array apparatus is to be installed. That is, correct angles of audio beams cannot be obtained unless the room where the speaker array apparatus is installed has an ideal shape such as a rectangular parallelepiped or a cube as shown in FIG. 12, and the speaker array apparatus is installed in a position and a direction satisfying computable conditions. For that reason, audio beams of the speaker array apparatus cannot be automatically set in a room having a special shape or a room where large-sized furniture has been placed. Thus, there has been a case where the beam angles have to be adjusted manually.

On the other hand, in the case of the latter method, a major part of adjustment of audio beams depends on the subjectivity of the setup man. Accordingly, an individual difference is apt to appear in a listening environment, and knowledge and experience are required for the setting operation. For that reason, a specialist for professionally adjusting the beam angles usually carries out the adjustment of the audio beams as described above. Thus, there has been a problem that it is difficult for a user to adjust the beam angles.

It is therefore an object of the present invention to provide a speaker array apparatus in which the degree of freedom in installation place of the speaker apparatus is so high that a user can set audio beams easily, and a method for setting the audio beams of the speaker array apparatus.

DISCLOSURE OF THE INVENTION

The present invention has the following configurations as means for solving the foregoing problems.

(1) A speaker array apparatus includes:

a speaker array having a plurality of speakers for outputting audio beams based on a test audio signal;

a test sound sweep portion for sweeping with the audio beams;

a microphone placed in a listening position and for collecting a test sound including direct sounds and reflected sounds of the audio beams output from the speaker array;

a storage portion for storing a signal level of the test sound collected by the microphone, and sweep angles with which audio beams corresponding to the test sound are output;

a selection portion for selecting a plurality of peaks of the signal level based on the signal level of the test sound stored in the storage portion; and a beam setting portion for setting the sweep angles of the selected plurality of peaks as beam output angles which are angles to output audio beams of channels of a multi-channel surround-sound respectively.

The plurality of speakers of the speaker array are disposed in a matrix or in lines.

The speaker array apparatus includes a signal processing portion for distributing an audio signal input from the outside to all or a part of the speakers of the speaker array, and controlling the output timings when sounds are output from these speakers, so that audio beams are output from the speaker array.

In order to reproduce a surround-sound in a background-art speaker array apparatus, it is necessary for a specialist to adjust directions to output audio beams of respective channels while reproducing sounds after this apparatus is installed. This causes increase in cost. In this configuration, when the speaker array apparatus is installed in a room, a microphone is placed in a listening position of a user. Audio beams of a test sound are output from the speaker array while being turned (swept) automatically. In this event, the audio beams are collected with the microphone. Peaks of the signal level are detected based on test sounds output from the speaker array directly to the microphone or test sounds reflected to the microphone from walls of the room. Accordingly, in order to reproduce an optimum surround-sound in the listening position, the positions of the walls of the room where the audio beams output from the array speaker should be reflected so that a multi-channel audio signal can be reproduced optimally can be detected easily in a short time. In addition, sweep angles with which the peaks were detected are set as angles with which audio beams should be output in respective channels of the multi-channel audio signal. Thus, the user can easily do settings for reproducing a multi-channel surround-sound after the installation of the speaker array apparatus regardless of the shape of the room where the speaker array apparatus is installed, the layout of furniture, and so on.

(2) The beam setting portion sets a sweep angle of a peak where the signal level of the test sound is the highest, as a beam output angle of a center channel of the multi-channel surround-sound.

Normally, a direct sound output from the speaker array toward the listening position is set as an audio beam of a center channel of a multi-channel surround-sound regardless of the shape of the room where the speaker array apparatus is installed. The signal level of this direct sound is higher than that of an audio beam reflected by a wall. Of sounds output from the speaker array apparatus, the direct sound is the highest in signal level. Therefore, if the highest peak is selected from the signal level of the test audio signal stored in the storage portion, a peak to be set as the output angle of the center channel can be detected easily. When the output angle of the audio beam of the center channel is determined, left and right with respect to the user can be determined. Thus, based on this output angle, output angles of the other channels can be set easily.

(3) When the number of peaks selected from the signal level of the test sound stored in the storage portion is smaller than the number of channels of the multi-channel surround-sound, the beam setting portion sets the sweep angles of the selected peaks as beam output angles of one or more channels of the multi-channel surround-sound, and sets sounds of channels other than the channels for which the beam output angles are set, as direct sounds to be output to be propagated directly to the listening position.

In this configuration, when the number of peaks selected from the signal level of the test sound signal is smaller than the number of channels of the multi-channel surround-sound, it is impossible to do settings so that all the channels of the multi-channel surround-sound are output as audio beams. Accordingly, settings are done so that direct sounds to be propagated directly to the listening position without using reflection by any wall are output as sounds of the channels other than the channels whose beam output angles have been set. For example, in the case of a 5.1ch surround-sound, assume that three peaks were detected. In this case, settings are done so that the highest peak is set as the beam output angle of the center channel, and the other peaks are set as the beam output angles of the surround-sound channels, while direct sounds are output as the front channels. In this manner, settings for reproducing the multi-channel surround-sound can be done properly in accordance with situation even if some channels are prevented from being output as audio beams due to the installation position of the speaker array apparatus, the shape of the room, the layout of furniture, etc.

(4) The speaker array apparatus includes an informing portion for providing at least information to prompt the user to change the listening position or to prompt the user to change a sound reproduction method when the beam output angle of the center channel of the multi-channel surround-sound set by the beam setting portion is shifted from a direction perpendicular to a front surface of the speaker array by an angle not smaller than a predetermined angle.

Assume that the beam output angle of the center channel of the multi-channel surround-sound is shifted from a direction perpendicular to the front surface of the speaker array by an angle not smaller than a predetermined angle. In this case, if the surround-sound is reproduced with the peaks set as the output angles of the audio beams respectively, the surround-sound will be off balance. In this configuration, at least the informing portion gives the user information to prompt the user to change the listening position or to prompt the user to change the sound reproduction method. Accordingly, in the aforementioned case, settings can be changed so that the surround-sound can be reproduced in a balanced manner.

(5) When the output angles set for the channels respectively are asymmetric with respect to the beam output angle of the center channel, the beam setting portion forms a signal localization of one of the channels as a phantom using audio beams directed in a plurality of directions so as to form a symmetric sound field.

Assume that the number of peaks on one side with respect to the center channel is the same as that on the other side, but the detected angles of the peaks are not symmetrical. In this case, if the surround-sound is reproduced as it is, the surround-sound will be off balance. In this configuration, therefore, when the sound balance among the channels is not good, audio beams directed in a plurality of directions are output as a signal of one of a pair of channels so that a plurality of identical audio signals coming from different directions can form a virtual phantom sound source localized in a direction internally divided in accordance with the power of a signal in the middle of the different directions. Accordingly, even if a plurality of audio signals come from different directions as described above, the listener does not recognize these signals as individual, but recognizes them as one audio signal coming from this phantom. Thus, when the phantom is adjusted to be formed in a position symmetric with a signal of the other channel, the surround-sound can be reproduced in a balanced manner.

(6) The speaker array apparatus further includes an input portion for accepting an input of installation position information of a body of the speaker array apparatus;

wherein the beam setting portion selects a plurality of peaks from the signal level of the test sound stored in the storage portion based on the installation position information of the body.

When an audio beam of a test audio signal from the speaker array apparatus is turned, a test audio signal having a characteristic changed in accordance with the position where the speaker array apparatus is installed in the room can be usually obtained. However, there is a case where a test audio signal having almost the same characteristic can be obtained in spite of a different position where the speaker array apparatus is installed in the room. In such a case, the beam output angles of the respective channels of a multi-channel surround-sound cannot be set properly. In this configuration, a plurality of peaks are selected based on the installation position information of the apparatus body accepted by the input portion. Accordingly, there is no fear that the aforementioned problem occurs, but it is possible to set optimum output angles of the audio beams in accordance with the installation position of the speaker array apparatus.

(7) The test sound sweep portion modulates the signal level of the test sound with an envelope having a maximum at the center of a sweep range of the audio beams.

In this configuration, the signal level is modulated with an envelope having a maximum almost at the center of a sweep range of the audio beams. When the listening position of the speaker array apparatus is set almost at the center of the sweep range of the audio beams, a peak to be set as the output angle of the center channel can be detected easily. When the output angle of the audio beam of the center channel is determined, left and right with respect to the user can be determined. Thus, based on this output angle, output angles of the other channels can be set easily.

(8) The speaker array outputs audio beams based on a test audio signal having no correlation and limited to a band where beams can be formed.

In this configuration, the speaker array apparatus outputs sounds limited to a band where beams can be formed by the speaker array, and having no periodicity and no correlation as if they were noise. Accordingly, the audio beams can be turned within a desired range. Even if an audio beam which has not been reflected overlaps an audio beam which has been reflected by a wall or the like, there is no fear that there occurs interference, but it is possible to collect test sounds surely.

(9) A method for setting audio beams in a speaker array apparatus, includes the steps of:

outputting audio beams based on a test audio signal from a speaker array having a plurality of speakers;

sweeping with the audio beams;

collecting, in a listening position, a test sound including direct sounds and reflected sounds of the audio beams output from the speaker array;

storing a signal level of the test sound collected in the sound collecting step, and sweep angles with which audio beams corresponding to the test sound are output, so as to associate the signal level with the sweep angles;

selecting a plurality of peaks of the signal level based on the stored signal level of the test sound; and setting sweep angles of the plurality of peaks selected in the selecting step, as beam output angles which are angles with which audio beams of channels of a multi-channel surround-sound should be output.

(10) In the beam setting step, a sweep angle of a peak where the signal level of the test sound is the highest is set as a beam output angle of a center channel of the multi-channel surround-sound.

(11) In the beam setting step, when the number of peaks selected from the stored signal level of the test sound is smaller than the number of channels of the multi-channel surround-sound, the sweep angles of the selected peaks are set as beam output angles of one or more channels of the multi-channel surround-sound, while sounds of channels other than the channels for which the beam output angles are set are set as direct sounds to be output to be propagated directly to the listening position.

(12) The method for setting audio beams further includes the step of providing at least information to prompt the user to change the listening position or to prompt the user to change a sound reproduction method when the beam output angle of the center channel of the multi-channel surround-sound set by the beam setting portion is shifted from a direction perpendicular to a front surface of the speaker array by an angle greater than or equal to a predetermined angle.

(13) In the beam setting step, when the output angles set for the channels respectively are asymmetric with respect to the beam output angle of the center channel, a signal localization of one of the channels is formed as a phantom using audio beams directed in a plurality of directions so as to form a symmetric sound field.

(14) The method for setting audio beams further includes the step of accepting an input of installation position information of a body of the speaker array apparatus;

wherein in the beam setting step, a plurality of peaks are selected from the signal level of the test sound stored in the storage portion based on the installation position information of the body.

(15) In the test sound sweep step, the signal level of the test sound is modulated with an envelope having a maximum at the center of a sweep range of the audio beams.

(16) Audio beams based on a test audio signal having no correlation and limited to a band where beams can be formed are output in the audio beam output step.

In these configurations, effects similar to those in (1) to (8) can be obtained.

When the speaker array apparatus according to the present invention is installed in a room, a microphone is placed in a listening position of a user, and a test sound is output from a speaker array so as to turn (sweep with) audio beams automatically. In this event, the audio beams are collected by the microphone. Thus, sounds output from the speaker array directly to the microphone or sounds reflected from walls of the room to the microphone can be detected as peaks of the signal level. By this, in order to reproduce an optimum surround-sound in the listening position, the positions of the walls of the room where the audio beams output from the array speaker should be reflected so that a multi-channel audio signal can be reproduced optimally can be detected easily in a short time. When the sweep angles with which the peaks were detected are set as angles with which audio beams of respective channels in a multi-channel audio signal should be output, the user can easily perform setting to reproduce the multi-channel surround-sound after the installation of the speaker array apparatus regardless of the shape of the room where the speaker array apparatus is installed, the layout of furniture, or the like.

BEST MODE FOR CARRYING OUT THE INVENTION

Figure 1:
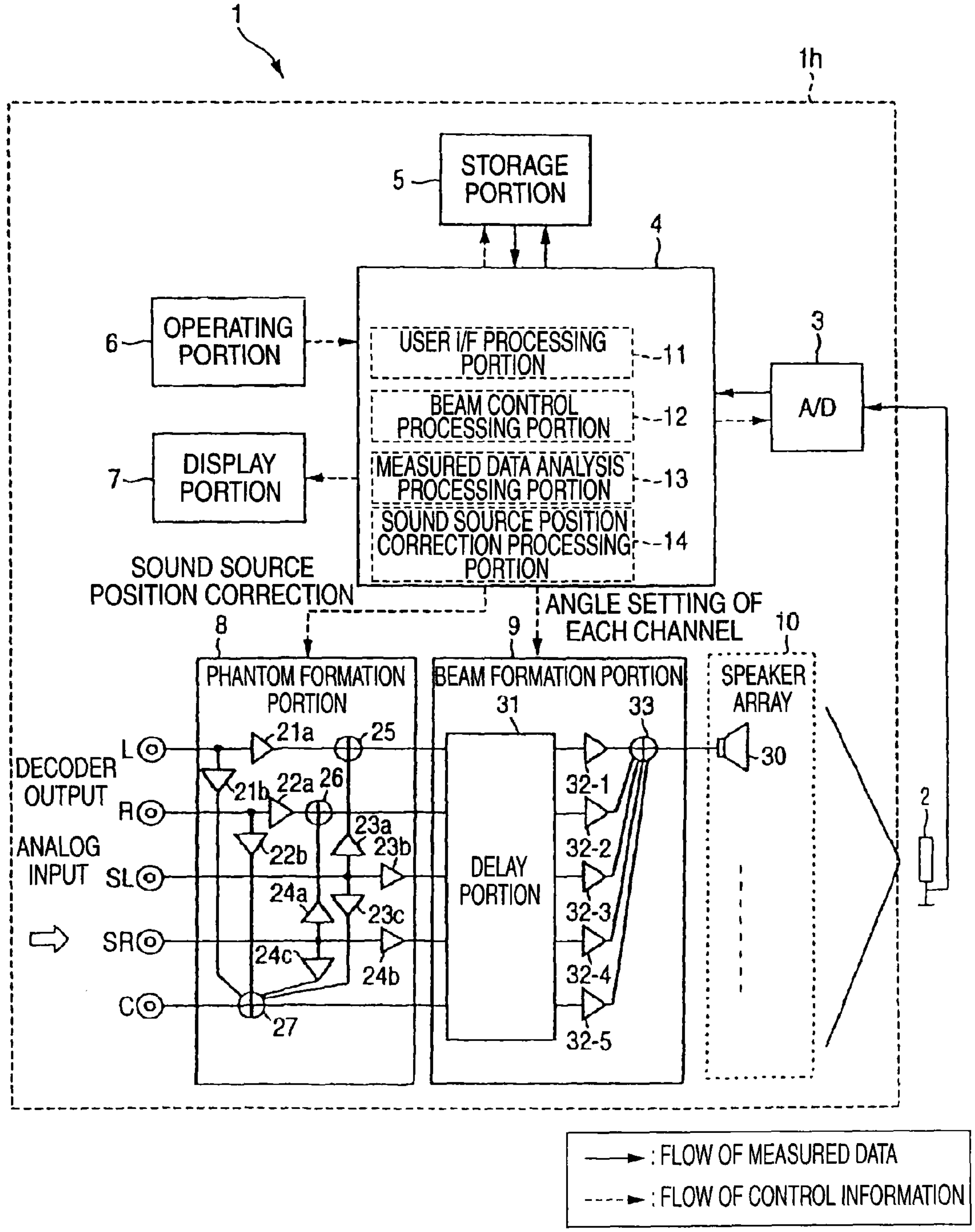
FIG. 1 A block diagram showing the schematic configuration of a speaker array apparatus according to an embodiment of the present invention.
Figure 2:
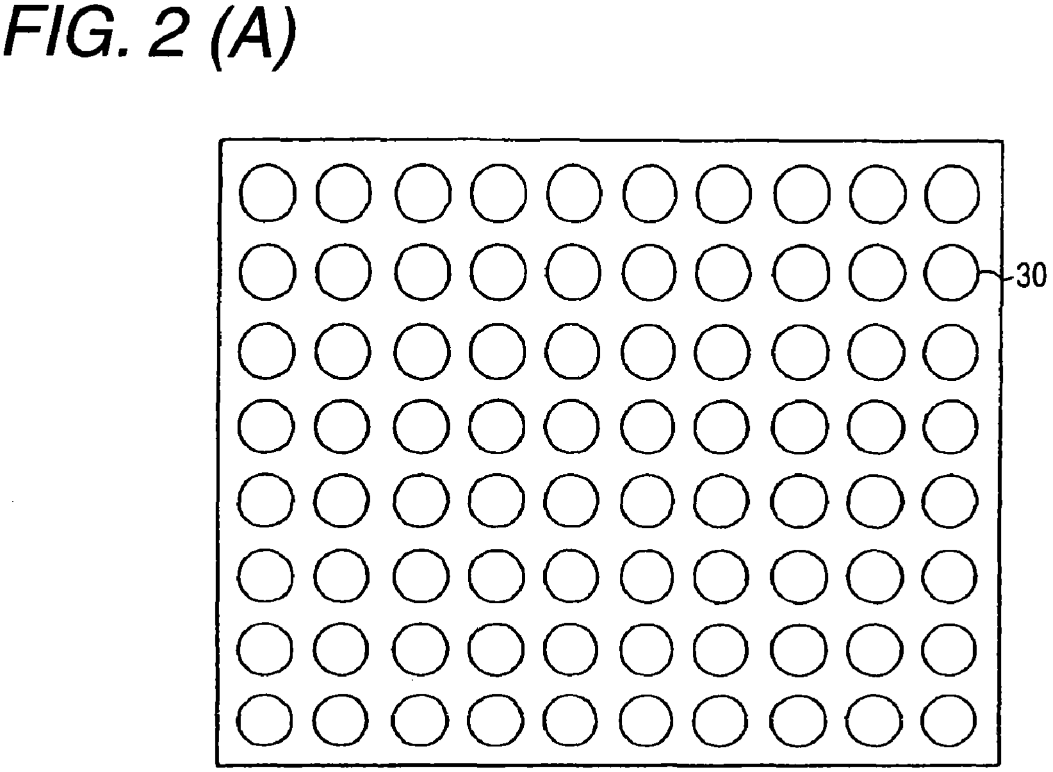
FIG. 2 Layout diagrams of speaker arrays.
Figure 2:
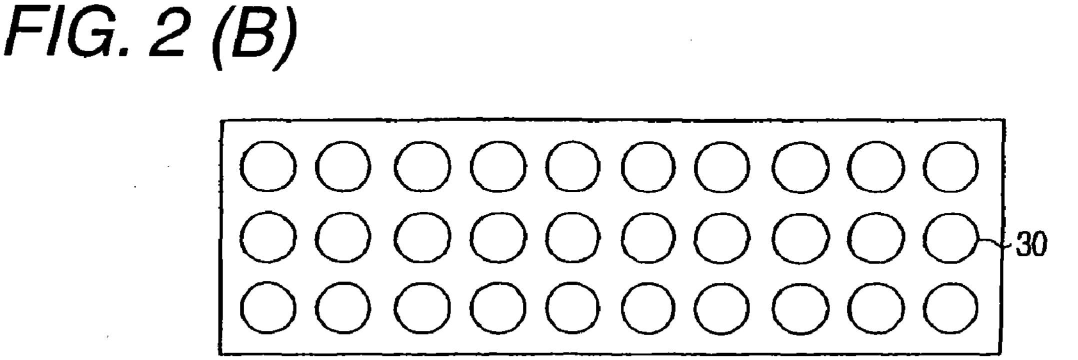
Figure 2:
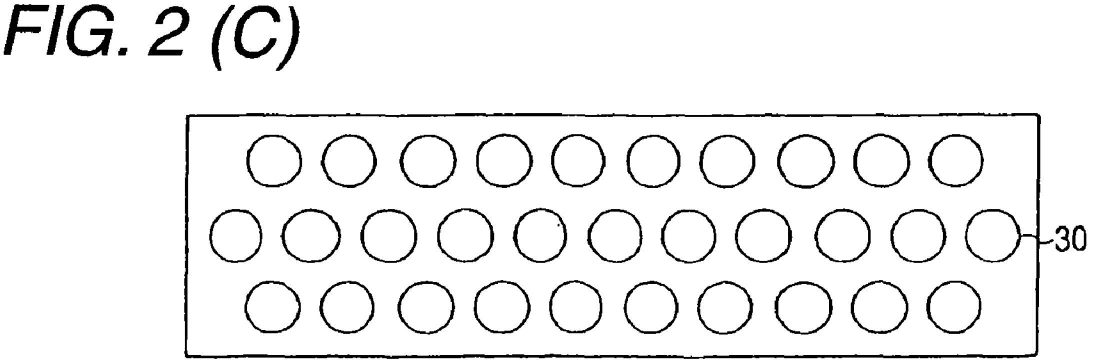

FIG. 1 is a block diagram showing the schematic configuration of a speaker array apparatus according to an embodiment of the present invention. FIG. 2 are views of layouts of speaker arrays, in which (A) shows the case where speakers are arrayed in a matrix, (B) shows the case where speakers are arrayed in three lines, and (C) shows the case where speakers are arrayed in three lines so that the speakers in the second line are displaced from the speakers in the first line and the speakers in the third line. The following description will be made about an example of a speaker array apparatus serving for a 5.1ch surround-sound system. In the following description, term a front left channel L(Left)ch, a front right channel R(Right)ch, a center channel C(Center)ch, a rear left channel SL(Surround Left)ch, a rear right channel SR(Surround Right)ch, and a subwoofer LFE(Low Frequency Effects)ch in the 5.1ch surround-sound system. In the 5.1ch surround-sound system, an audio signal of the LFEch has little directivity, but the audio signal is output from the speaker array apparatus directly to the user. Therefore, description about the processing of the audio signal of the LFEch will be omitted in the following description.

The speaker array apparatus 1 has a microphone 2, an A/D converter 3, a system control portion 4, a storage portion 5, an operating portion 6, a display portion 7, a phantom formation portion 8, a beam formation portion 9, and a speaker array 10. In addition, the speaker array apparatus 1 has an Lch terminal, an Rch terminal, an SLch terminal, an SRch terminal and a Cch terminal as external input terminals of 5.1ch surround-sound audio signals. Further, the phantom formation portion 8 has Lch amplifiers 21*a* and 21*b*, Rch amplifiers 22*a* and 22*b*, SLch amplifiers 23*a*, 23*b* and 23*c*, SRch amplifiers 24*a*, 24*b* and 24*c*, an Lch adder 25, an Rch adder 26 and a Cch adder 27. In addition, the beam formation portion 9 has a delay portion 31 for performing delay processing upon five audio signals output from the phantom formation portion 8 individually, power amplifiers 32-1 to 32-5 for amplifying the five audio signals output from the delay portion 31, and an adder 33 for adding signals output from the power amplifiers 32-1 to 32-5 respectively. The beam formation portion 9 consists of n blocks, and the speaker array 10 consists of n speakers 30, so that the speakers 30 are connected to the outputs of the beam formation portion 9 respectively.

The portion of the speaker array apparatus 1 excluding the microphone 2 will be referred to as a body 1*h*.

The microphone 2 is a non-directional microphone, which is connected to the A/D converter 3.

The A/D converter 3 converts (samples) an analog audio signal collected by the microphone 2, into a digital audio signal, and outputs the digital audio signal to the system control portion 4.

The system control portion 4 has a user I/F processing portion 11, a beam control processing portion 12, a measured data analysis processing portion 13, and a sound source position correction processing portion 14.

The user I/F processing portion 11 outputs a control signal to each part of the speaker array apparatus 1 in accordance with an operation accepted by the operating portion 6. The user I/F processing portion 11 makes the display portion 7 display contents to impart to the user in accordance with the condition of the apparatus.

When an audio beam setting mode is carried out for setting the angles with which audio beams of the respective channels should be output, for example, when the speaker array apparatus 1 is installed, the beam control processing portion 12 outputs a test audio signal to the beam formation portion 9 so as to sweep with (turn) audio beams of a test sound output from the speaker array 10.

The measured data analysis processing portion 13 makes the storage portion 5 store the test audio signal output from the speaker array 10 and collected by the microphone 2 when the audio beam setting mode is carried out. When the audio signal has been collected, the measured data analysis processing portion 13 reads the audio signal stored in the storage portion 5 and detects peaks in the audio signal. Based on the peaks, the measured data analysis processing portion 13 sets the angles with which sounds of the respective channels Cch, Lch, Rch, SLch and SRch should be output. The measured data analysis processing portion 13 outputs the results to the beam control processing portion 12.

Based on the analysis results output from the measured data analysis processing portion 13, the beam control processing portion 12 outputs angle setting signals to the beam formation portion 9. The angle setting signals will be used for setting the angles of the channels respectively. As a result of analysis of the sweep signal collected by the microphone 2, the measured data analysis processing 13 outputs a signal to the sound source position correction processing portion 14 when the angle balance among the channels is not good.

The sound source position correction processing portion 14 outputs a sound source position correction signal to the phantom formation portion 8 based on the signal received from the measured data analysis processing portion 13.

When setting to increase the measuring accuracy is done, the system control portion 4 controls each part of the speaker array apparatus 1 to execute sweep a plurality of times so as to execute an integrating/averaging process or the like upon audio signals.

The storage portion 5 stores digital audio signals output from the A/D converter 3 through the system control portion 4.

For example, when the speaker array apparatus 1 is installed, the operating portion 6 accepts inputs of various settings from the user and outputs a signal to the system control portion 4 in accordance with the inputs.

The display portion 7 displays contents to be transmitted to the user based on the control signal output from the system control portion 4.

When it is necessary to form a phantom (virtual image), the phantom formation portion 8 performs processing for phantomizing audio signals of specific channels based on the sound source position correction signal output by the system control portion 4, and outputs a created phantom formation signal to the beam formation portion 9.

Here, the phantom designates a virtual sound source localized in an intermediate direction (direction internally divided in accordance with signal power) of different directions of a plurality of (identical) audio signals arriving from the different directions. Even when a plurality of audio signals arrive from different directions as described above, the listener does not recognize these signals individually but recognizes them as one audio signal arriving from this phantom. The phantom formation portion 8 performs processing for phantomizing audio signals of specific channels based on the sound source position correction signal output by the system control portion 4 and outputs a created phantom formation signal to the beam formation portion 9. Thus, a plurality of audio beams are set to arrive at the listening position of the user from different directions as if a sound were output from a phantom sound source.

The beam formation portion 9 forms audio beams for the respective channels based on angle setting signals of the channels output from the system control portion 4 respectively, and outputs audio signals to the speaker array 10. When a sweep signal is output from the system control portion 4, the beam formation portion 9 processes the audio signals so as to sweep with audio beams output from the speaker array 10, and outputs the audio signals to the speaker array 10.

The speaker array 10 outputs audio beams of the respective channels based on the audio signals output from the beam formation portion 9.

Here, as shown in FIG. 2, the speaker array 10 has a plurality (n) of speakers 30 disposed in a predetermined array of a matrix, lines or the like on one panel. The speaker array 10 adjusts the timing when a surround-sound is output from each speaker in each channel, so as to emit the surround-sound like beams. The speaker array 10 delays and controls the audio beams so that the audio beams have a focus in a desired position on the wall surface or the like. The sounds of the respective channels are reflected by the walls of the room where the speaker array apparatus 1 is installed, so that a sound source is created at a desired point. Thus, a multi-channel sound field is formed to reproduce the surround-sound.

Figure 3:
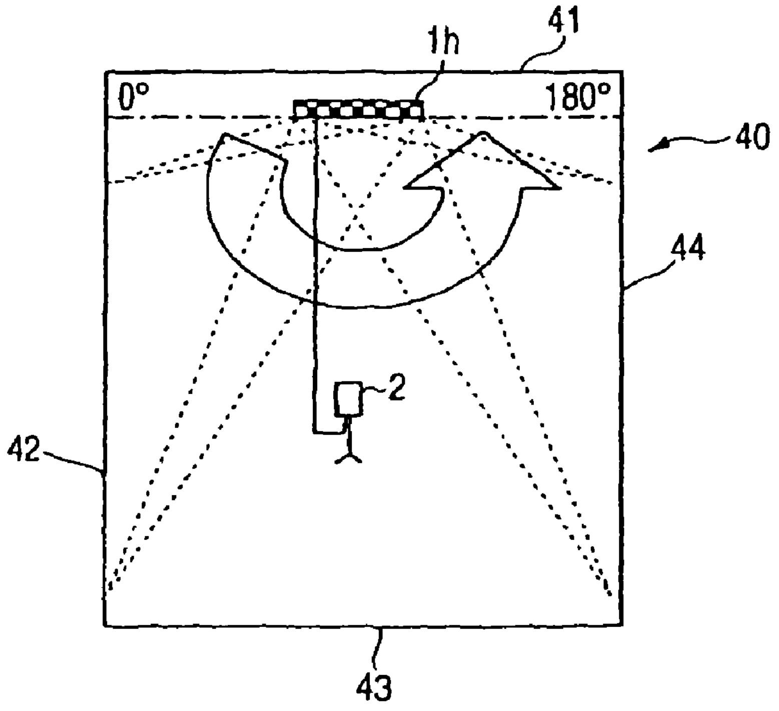
FIG. 3 Top views of a room where the speaker array apparatus is installed, which are views for explaining the operation of the speaker array apparatus sweeping with audio beams and the operation of a microphone collecting the audio beams.
Figure 3:
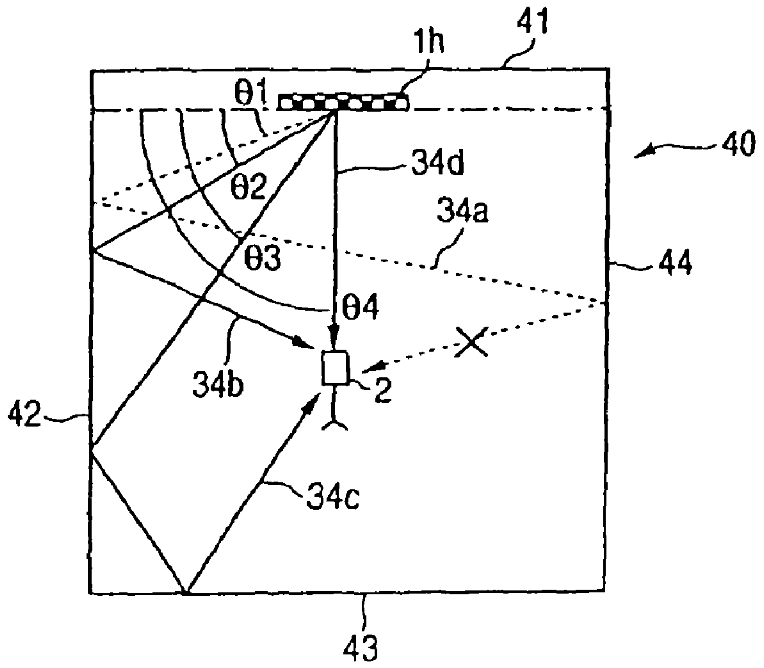

Next, description will be made about the operation of the speaker array apparatus 1. FIG. 3 are top views of the room where the speaker array apparatus is installed. FIG. 3 are views for explaining the operation of the speaker array apparatus sweeping with audio beams and the operation of the microphone collecting the audio beams. Here, in FIG. 3, description will be made about the case that a room 40 where the speaker array apparatus 1 is installed is a rectangular parallelepiped having an ideal shape, and the body 1*h* of the speaker array apparatus 1 is placed near the center of a front wall 41 of the room 40, in order to make the present invention understood easily.

When the speaker array apparatus 1 is installed in the room 40, the body 1*h* of the speaker array apparatus 1 is placed in a position desired by the user, which is near at the center of the front wall 41, so that the front surface of the speaker array 10 is made parallel to the front wall 41 and opposite to a rear wall 43 so as to output sounds to the inside of the room, as shown in FIG. 3(A). The microphone 2 connected to the A/D converter 3 of the speaker array apparatus 1 is placed in a listening position (audience position) of the user. In this event, it is preferable that the height of the microphone 2 is suited to the ear position of the user. FIG. 3(A) shows the case where the listening position is set in a position close to the rear wall 43 with respect to the center of the room 40.

When the body 1*h* and the microphone 2 of the speaker array apparatus 1 have been placed and an audio beam setting mode has been set, the speaker array apparatus 1 sweeps with (turns) audio beams from one direction parallel with the front surface of the speaker array 10 (hereinafter referred to as "0-degree direction") to the other direction parallel to the front surface of the speaker array 10 (hereinafter referred to as "180-degree direction") when the speaker array 10 is viewed from above the room 40. In some shape of the room where the speaker array apparatus 1 is installed or in some position where the speaker array apparatus 1 is installed, the sweep angle θ of the audio beams may be set at a value other than the value satisfying the relation $0° \leqq \theta \leqq 180°$.

When sweeping with the audio beams is performed thus, the audio beams are reflected by a left wall 42, the rear wall 43 and a right wall 44 of the room 40 in accordance with the sweep angle θ of the audio beams output from the speaker array 10. In this event, direct sounds of the audio beams and indirect sounds of the audio beams reflected by the respective walls are collected by the microphone 2, and optimized angles with which the audio beams should be output are obtained.

For example, as shown in FIG. 3(B), when the sweep angle $\theta=\theta 1$, an audio beam 34*a* reflected by the left wall 42 and the right wall 44 arrives at the microphone 2. Therefore, the angle of the audio beam 34*a* is not suitable as an angle with which an audio beam of the L channel should be output. When the sweep angle $\theta=\theta 2$, an audio beam 34*b* reflected by the left wall 42 arrives at the microphone 2. Therefore, the angle of the audio beam 34*b* is suitable as the angle with which the audio beam should be output. Thus, the angle can be set as the output angle of the Lch audio beam. Further, when the sweep angle $\theta=\theta 3$, an audio beam 34*c* reflected by the left wall 42 and the rear wall 43 arrives at the microphone 2. Therefore, the angle of the audio beam 34*c* is suitable as an angle with which an SLch audio beam should be output. Thus, the angle can be set as the output angle of the SLch audio beam. In addition, when the sweep angle $\theta=\theta 4$, an audio beam 34*d* arrives at the microphone 2 directly. Therefore, the angle of the audio beam 34*d* is suitable as an angle with which an audio beam should be output. Thus, the angle can be set as the output angle of the Cch audio beam.

The audio beams output from the speaker array 10 in the audio beam setting mode are set by the system control portion 4 so as to have no correlation but to output audio signals whose beam angles are limited to a controllable range though the beam angles should depend on the shape of the speaker array apparatus 1 and the layout of the respective speakers of the speaker array 10. Acoustic waves having no periodicity, for example, around 4 kHz, or acoustic waves such as noise having no periodicity are suitable as test audio signals. Thus, the audio beams can be turned within a predetermined range. In addition, even if an audio beam having not been reflected overlaps an audio beam having been reflected by the wall or the like, a test sound can be collected surely without occurrence of interference.

In the speaker array apparatus 1, the elevation angles (depression angles) of the audio beams output from the front surface of the speaker array 10 can be set at desired angles in accordance with the position and height where the speaker array apparatus 1 is installed. In addition, the speaker array apparatus 1 may be designed in such a manner that the elevation angles (depression angles) are changed whenever sweeping with the audio beams is performed over the range of from 0 degree to 180 degrees, so that the audio beams are output all over the room. As a result, an optimum acoustic field can be formed, for example, when a virtual speaker can be formed in an optimum position by the audio beams reflected by the ceiling and the rear wall.

Figure 4:
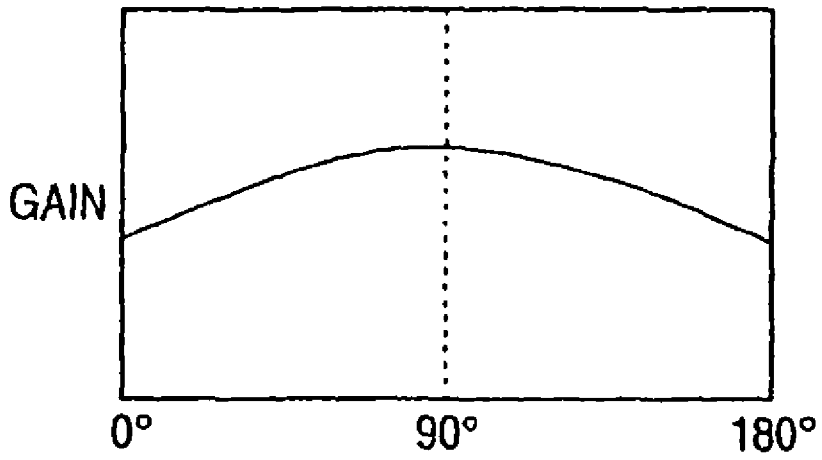
FIG. 4 Graphs showing the relationship between the angle and the gain of a sweep signal and the relationship between the angle and the focal length.
Figure 4:
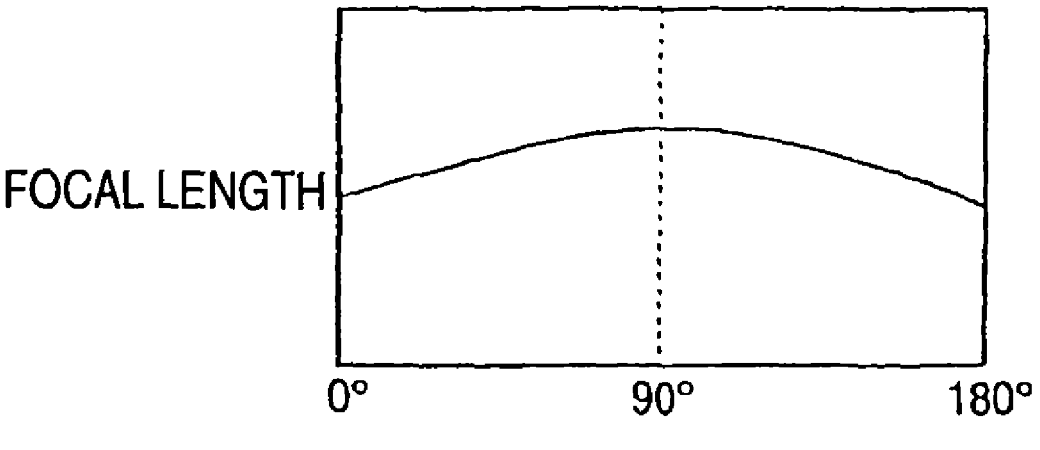

FIG. 4 are graphs showing the relationship between the angle of the sweep signal and the gain and the relationship between the angle and the focal length. It is preferable that the signal level of the test sound is set to have a modulated envelope with a peak at the center of the sweep range of the audio beams so that the gain of the audio beams of the test sound output from speaker array 10 while sweeping (hereinafter also referred to as "sweep signal") is the highest in a recommended listening position (perpendicular to the front surface of the speaker array 10) of the user. That is, as shown in FIG. 4(A), setting may be done so that the gain level of the sweep signal varies in a parabola with a peak at 90°. As a result, when the listening position is set in front of the speaker array 10, the output angle of the Cch audio beam is set at 90°. Thus, the output angle of the Cch audio beam can be set easily. In addition, the detectivity (S/N ratio) of each surround-sound channel having a long beam path can be increased. Further, an optimum angle can be set easily for an audio beam of each channel.

It is preferable that the focal length of the sweep signal is set so that the beam diameter is the narrowest in the listening position of the user in each sweep angle. That is, as shown in FIG. 4(B), setting may be done so that the focal length with which the beam diameter is the narrowest varies in a parabola having a peak at 90°. Thus, it is possible to improve the angular sensitivity of the beams in the microphone position.

Figure 5:
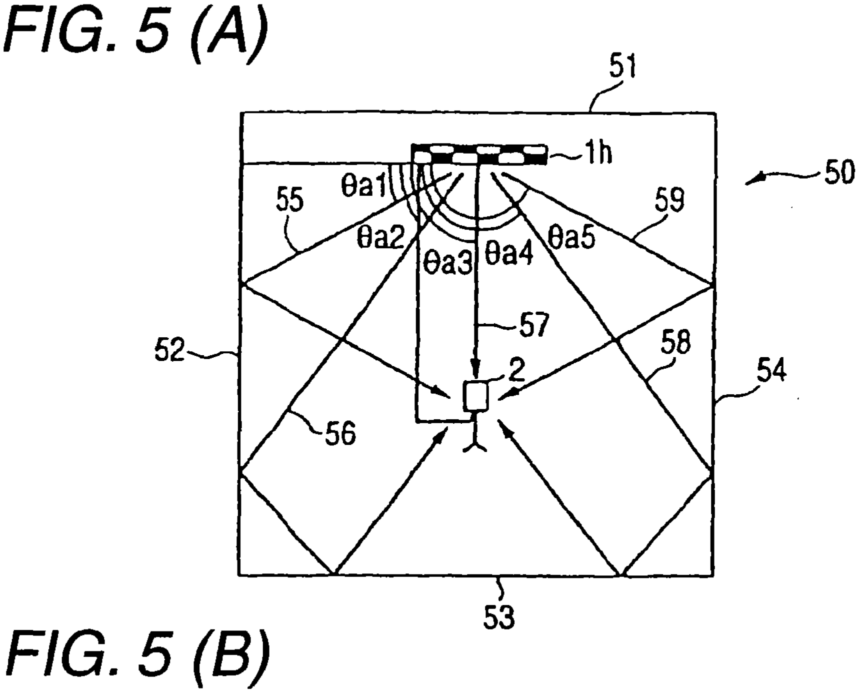
FIG. 5 Diagrams for explaining the operation when the speaker array apparatus is installed.
Figure 5:
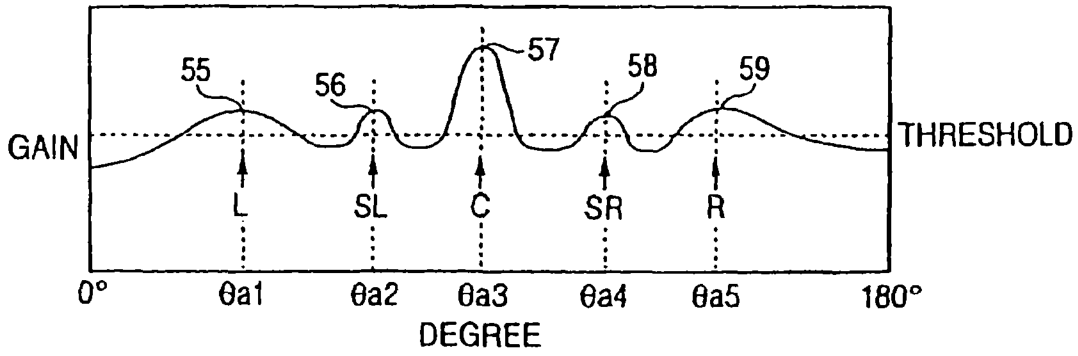
Figure 5:
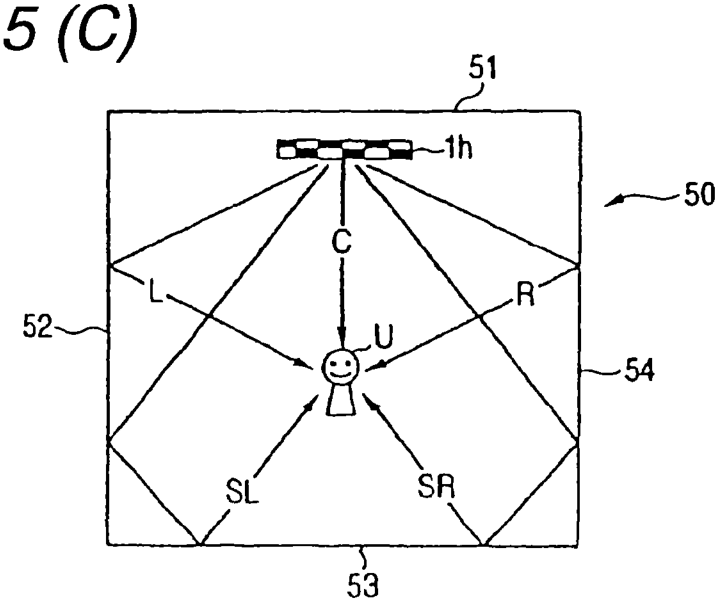

Next, description will be made about the specific operation for setting the output angles of the audio beams when the speaker array apparatus 1 is installed. FIG. 5 are diagrams for explaining the operation when the speaker array apparatus is installed: (A) is a top view showing the operation for measuring the audio beams when the speaker array apparatus is installed near the center of the front wall in a room having a rectangular parallelepiped shape; (B) is a graph showing measured data; and (C) is a top view of the rectangular parallelepiped room after the speaker array apparatus has been installed.

As shown in FIG. 5, the body 1*h* of the speaker array apparatus 1 is installed near the center portion of the front wall 51 in the rectangular parallelepiped room 50 which is a room having an ideal shape. In this case, the user U places the microphone 2 in the listening position where the user U should listen to surround-sound. When the user U sets the audio beam setting mode, sweeping with audio beams is started. That is, the speaker array apparatus 1 collects audio beams through the microphone 2 while sweeping with the audio beams over the range of from the 0-degree direction to the 180-degree direction in front of the speaker array 10. The audio data are stored in the storage portion 5. When sweeping with the audio beams is terminated, the system control portion 4 reads the data from the storage portion 5 and analyzes the data, with the result that the result shown in FIG. 5(B) is obtained. Here, FIG. 5(B) shows data from which noise has been removed. In fact, the waveform of the measured data may be deformed or slightly varied due to noise or the like. In the graph shown in FIG. 5(B), the abscissa designates the beam angle, and the ordinate designates the gain of the audio data collected by the microphone 2. In order to detect a plurality of peaks from the audio data easily, a threshold value is set in a level with which only the audio beams reflected by the wall up to two times can be detected. Further, all the angle-gain graphs which will be described hereinafter will be expressed in the same manner as FIG. 5(B).

The system control portion 4 sets a sweep angle θa3 of a peak 57, which has the highest gain level of peaks located within a valid range and having a width not smaller than a predetermined width, as the angle with which the Cch audio beam should be output. The sound set as Cch has the highest level because it is measured as a direct sound of the audio beam. As described with reference to FIG. 4(A), the gain is varied in a parabola with a peak at 90° so that the Cch sound has the highest level.

Subsequently, the system control portion 4 selects and detects how many peaks beyond the threshold value of the gain are present in areas on the opposite sides (temporally in front and behind and angularly left and right) with respect to the peak set as Cch, excluding peaks too close to the peak 57 set as Cch or peaks corresponding to angles which are impossible as the installation angles of virtual speakers based on common sense. When the same number of peaks are located on the opposite sides with respect to the peak 57 set as Cch, the system control portion 4 assigns the peaks to the surround-sound channel and the front channel in order of increasing distance from the peak 57 set as Cch, and calculates the angles corresponding to the peaks. That is, the system control portion 4 sets a sweep angle θa1 as an output angle of Lch, a sweep angle θa2 as an output angle of SLch, a sweep angle θa3 as an output angle of Cch as described above, a sweep angle θa4 as an output angle of SRch, and a sweep angle θa5 as an output angle of Rch.

When an audio sound or the like is input from the outside, the speaker array apparatus 1 outputs, to the user U, the Cch sound as a direct sound, the Lch sound as a reflected sound reflected once by the left wall 52, the SLch sound as a reflected sound reflected twice by the left wall 52 and the rear wall 53, the SRch sound as a reflected sound reflected twice by the right wall 54 and the rear wall 53, and the Rch sound as a reflected sound reflected once by the right wall 54, as shown in FIG. 5(C). Thus, the user U can enjoy listening the ideal surround-sound in the listening position.

Figure 6:
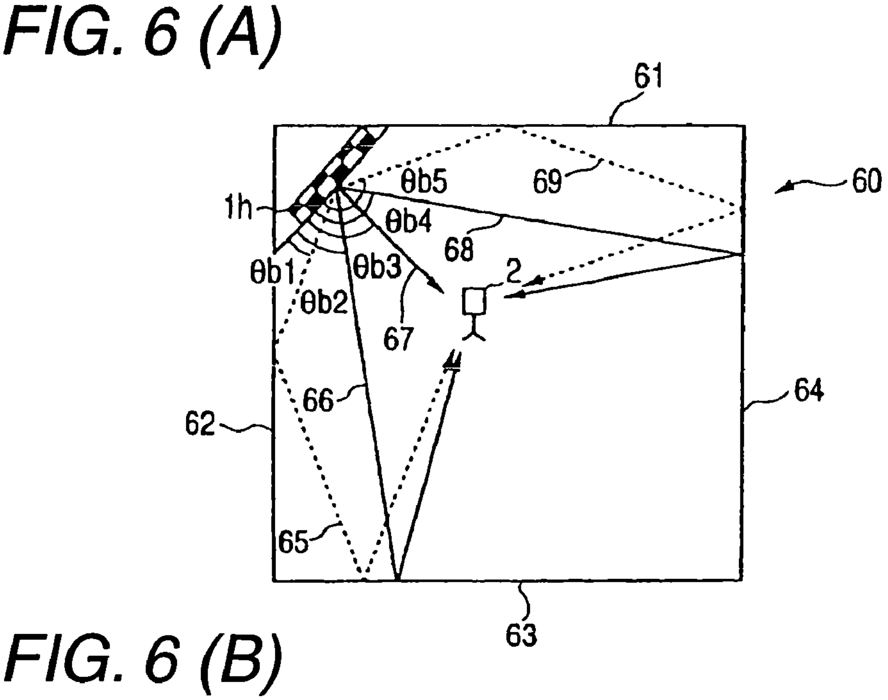
FIG. 6 Diagrams for explaining the operation when the speaker array apparatus is installed, which are diagrams different from FIG. 5.
Figure 6:
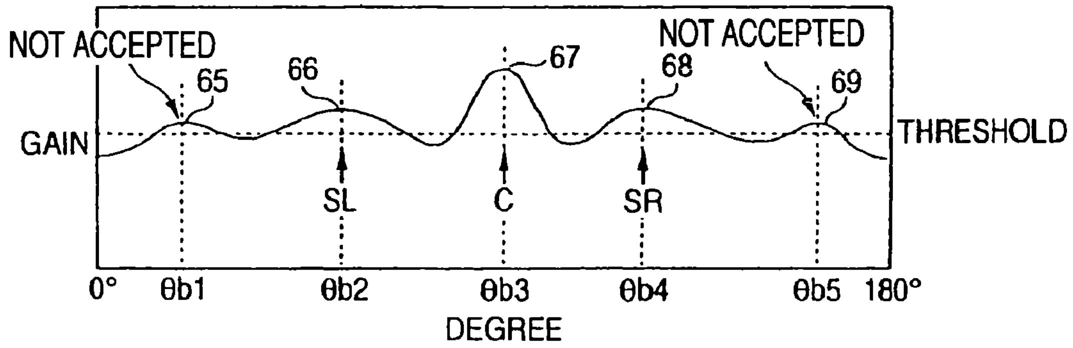
Figure 6:
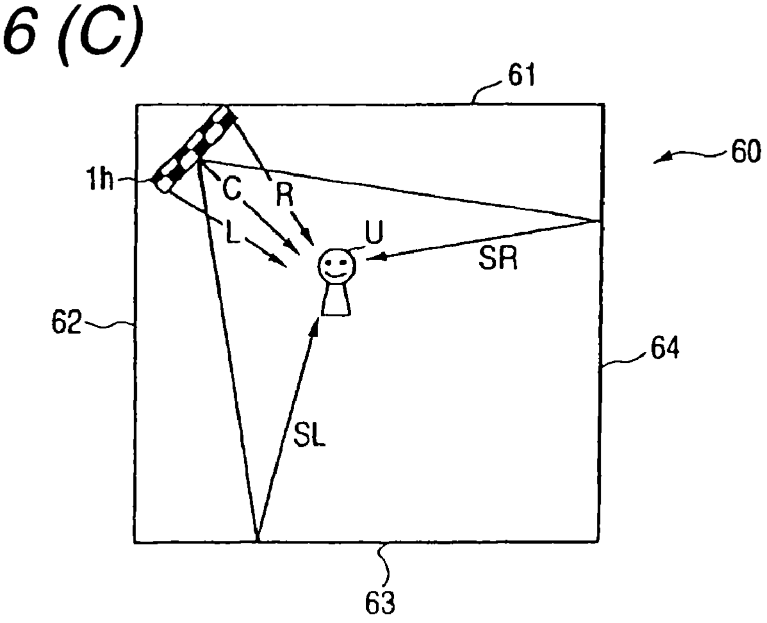

FIG. 6 are diagrams for explaining the operation for installing the speaker array apparatus: (A) is a top view showing the operation for measuring the audio beams when the speaker array apparatus is installed in a corner of a room having a rectangular parallelepiped shape; (B) is a graph showing measured data from which noise has been eliminated; and (C) is a top view of the rectangular parallelepiped room after the speaker array apparatus has been installed.

FIG. 6 show the case where the speaker array apparatus 1 is installed in a corner as an end portion between a front wall 61 and a left wall 62 of a room 60 having a rectangular parallelepiped shape, so that the front surface of the speaker array 10 is directed obliquely to the inside of the room. Also in this case, the audio beam setting mode is carried out in the same manner, so as to collect sound data.

When the speaker array apparatus 1 is disposed as shown in FIG. 6(A) and the audio beam setting mode is carried out to collect audio data, peaks 65-69 whose gain levels are higher than a threshold value are obtained as shown in FIG. 6(B). In this case, since there are five peaks whose gain levels are higher than the threshold value, the speaker array apparatus 1 will set angles with which audio beams should be output, in the same manner as in FIG. 5(B).

However, as shown in FIG. 6(A), the peak 65 which should be set as Lch derives from an audio beam reflected twice by the left wall 62 and the rear wall 63, and the peak 69 which should be set as Rch derives from an audio beam reflected twice by the right wall 64 and the rear wall 63. The sounds of the front channels are listened to from directions where surround-sounds should be listened to. Thus, those angles are not proper as angles with which the audio beams should be output.

In order to prevent such a problem, in the speaker array apparatus 1 according to the present invention has an assist information function in which the position where the speaker array apparatus 1 has been installed can be input before the audio beam setting mode is carried out. The speaker array apparatus 1 accepts information about the position where the speaker array apparatus 1 has been installed, in a corner of the room or along a wall. Due to the assist information function provided in the speaker array apparatus 1, the angles with which the audio beams should be output can be set based on the peak detection angles of the audio beams and the information about the position where the speaker array apparatus 1 has been installed.

For example, in the example shown in FIG. 6, the speaker array apparatus 1 is installed in a corner of the room 60. Therefore, the user operates the operating portion 6 to select "corner installation" before the audio beam setting mode is carried out.

As a result, even when peaks are detected two by two symmetrically with respect to a center peak as shown in FIG. 6(B), the system control portion 4 of the speaker array apparatus 1 sets stereophonic reproduction with two peaks close to the center peak as the surround-sound channels and with a direct sound as the front channel.

The system control portion 4 sets a sweep angle θb3 of the peak 67 having the highest gain level of the peaks located within a valid range as the angel with which the Cch audio beam should be output. The system control portion 4 selects and detects how many peaks beyond the threshold value of the gain are present in areas on the opposite sides with respect to the peak set as Cch, excluding peaks too close to the peak 67 set as Cch or peaks corresponding to angles which are impossible as the installation angles of virtual speakers based on common sense. That is, the peaks 66 and 68 are selected when the sweep angles θ=θb2 and θb4. In this case, the number of peaks present on each side with respect to the peak 66 set as Cch is the same as that on the other. Since the number of the peaks present on the opposite sides is only two, the two peak values are assigned to the surround-sound channels, and the direct sound is assigned to the front channel so as to carry out stereophonic reproduction.

Accordingly, when an audio sound or the like is input from the outside, the speaker array apparatus 1 outputs, to the user U, the Cch, Lch and Rch sounds as direct sounds, the SLch sound as a reflected sound reflected once by the rear wall 63, and the SRch sound as a reflected sound reflected once by the right wall 64, as shown in FIG. 6(C). Thus, the user U can enjoy listening the ideal surround-sound in the listening position.

When the Ch, Lch and Rch sounds are output as direct sounds from the speaker array 10, for example, it is preferable that setting is done so that the Cch sound is output from the center portion of the speaker array 10, the Lch sound is output from the left side with respect to the center of the speaker array 10, and the Rch sound is output from the right side with respect to the center of the speaker array 10. It is also preferable that the region from which the Lch and Rch are output are divided into a low frequency region, a middle frequency region and a high frequency region so as not to form the sounds into beams, and the sounds are output from the respective regions.

Figure 7:
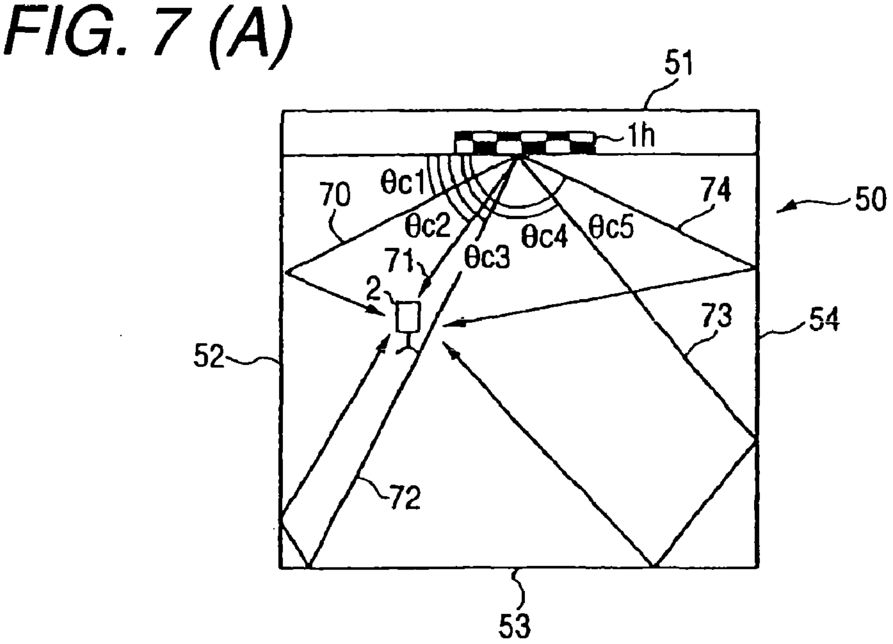
FIG. 7 Diagrams for explaining the operation when the speaker array apparatus is installed, which are diagrams different from FIGS. 5 and 6.
Figure 7:
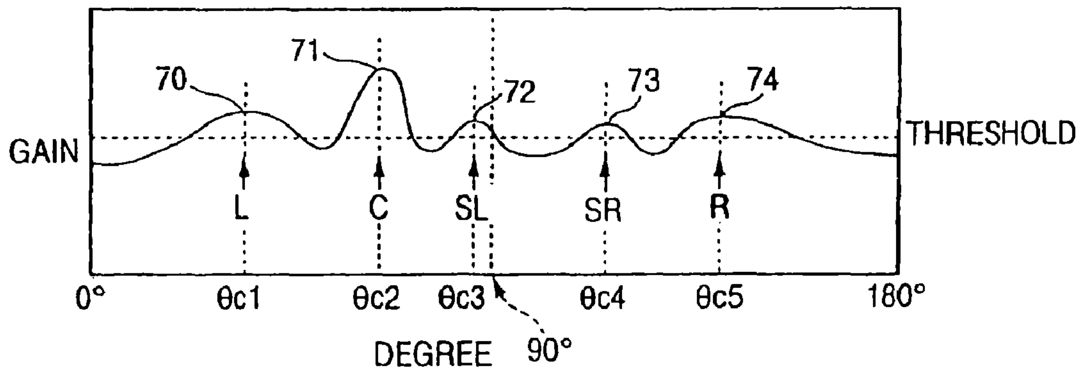

FIG. 7 are diagrams for explaining the operation for installing the speaker array apparatus: (A) is a top view showing the operation for measuring audio beams when the speaker array apparatus is installed near the center of the front wall but in a different position from that in FIG. 5 in a room having a rectangular parallelepiped shape; and (B) is a graph showing measured data.

FIG. 7 show the case where the body 1*h* of the speaker array apparatus 1 is installed near the center portion of the front wall 51 in the rectangular parallelepiped room 50 shown in FIG. 5, and the listening position of the user is set halfway between the center of the room and the left wall 52. The user U places the microphone 2 in the position where the user U should listen to surround-sound. The user U sets the audio beam setting mode for measuring. Collected data are stored in the storage portion 5. The system control portion 4 reads the collected sound data from the storage portion 5 and analyzes the data. The system control portion 4 sets a sweep angle θ=θc2 of a peak 71, which has the highest gain level of peaks located within a valid range, as the angle with which the Cch audio beam should be output. Subsequently, the system control portion 4 selects and detects how many peaks beyond the threshold value of the gain are present in areas on the opposite sides with respect to the peak 71 set as Cch, excluding peaks too close to the peak set as Cch or peaks corresponding to angles which are impossible as the installation angles of virtual speakers based on common sense. As a result, a total of four peaks 70, 72, 73 and 74 corresponding to sweep angles θ=θc1, θc3, θc4 and θc5 are selected. In this event, the listening position is widely displaced from the front of the speaker array 10. As for the peaks other than the peak 71 set as Cch, therefore, the number of peaks on one side with respect to the peak 71 is not the same as the number of peaks on the other side. If the peaks are assigned to the output angles of audio beams respectively, surround-sound will be off balance in the listening position. To solve this problem, in the speaker array apparatus 1, when the angle of the listening position is displaced by an angle not smaller than a predetermined constant angle, the listening position is changed, or the contents to prompt the user to change the listening position are shown on the display portion 7. Alternatively, the contents to prompt the user to change the configuration of the audio beams are displayed on the display portion 7. As the contents to prompt the user to change the listening position, for example, the speaker array apparatus 1 makes the display portion 7 display an instruction to move the listening position to a position opposed to the front of the speaker array 10 and carry out the audio beam setting mode again. Alternatively, as the contents to prompt the user to change the configuration, the speaker array apparatus 1 makes the display portion 7 display an instruction to select a setting mode to stereophonically reproduce all the channels or to reproduce Lch and Rch as stereophonic sounds and reproduce SLch and SRch as surround-sounds. The user changes the listening position in accordance with this instruction and carries out the audio beam setting mode again. Alternatively, the user changes the configuration such that setting can be done to properly reproduce surround-sounds in the speaker array apparatus 1.

Figure 8:
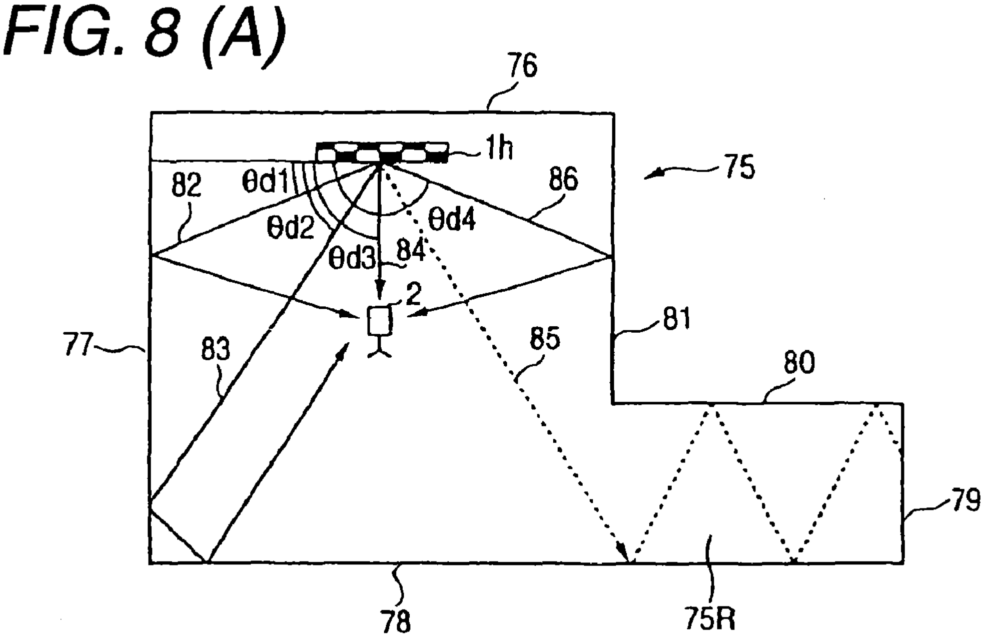
FIG. 8 Diagrams for explaining the operation when the speaker array apparatus is installed, which are diagrams different from FIGS. 5-7.
Figure 8:
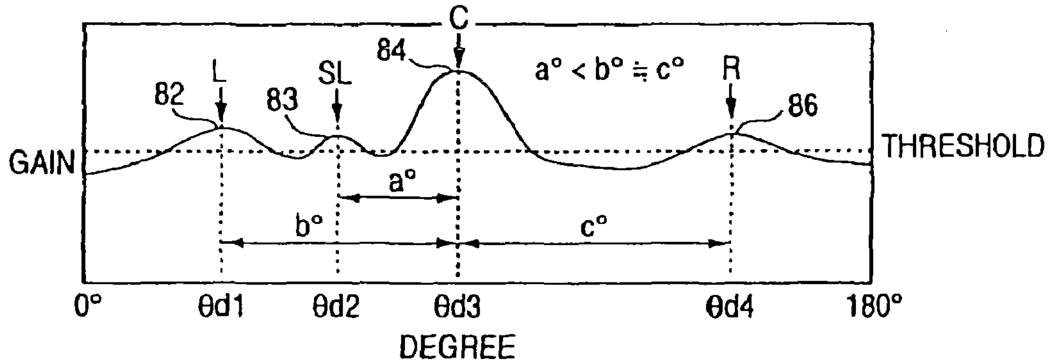
Figure 8:
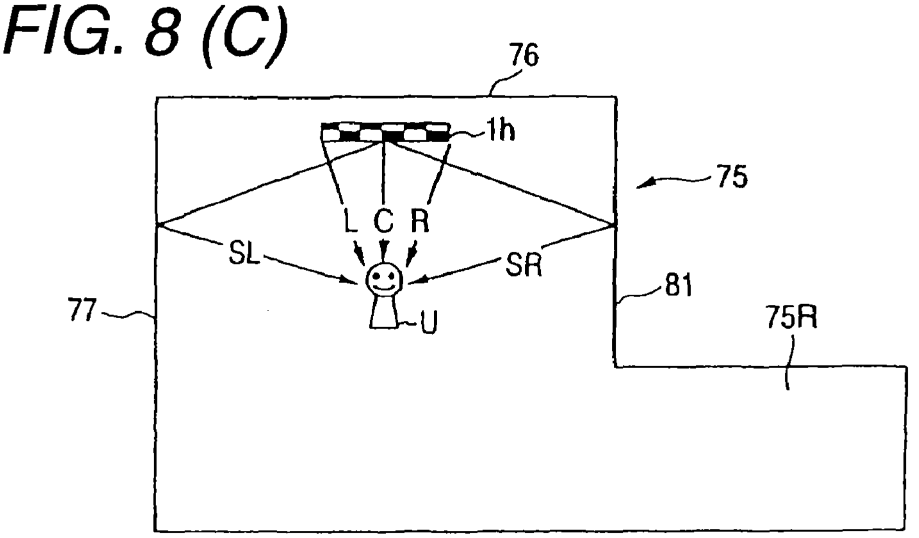

Next, description will be made about a specific operation for setting output angles of audio beams when the speaker array apparatus 1 is installed in a room which is not ideal. FIG. 8 are diagrams for explaining the setting operation of the speaker array apparatus: (A) is a top view showing the operation in which the speaker array apparatus 1 is installed near the center of the front wall of the room and audio beams are measured; and (B) is a graph showing the measured data.

FIG. 8 show a room 75 in which a hallway 75R is provided on the side of a right wall 81 of the rectangular parallelepiped room so as to extend along a rear wall 78. The body 1*h* of the speaker array apparatus 1 is placed near the center portion of a front wall 76, and the listening position of the user is set at the center of the room 75 excluding the hallway 75R. The user U places the microphone 2 in the position where the user U should listen to surround-sound. When the user U sets the audio beam setting mode, the speaker array apparatus 1 starts to sweep with audio beams and collect audio data. As a result, as shown in FIG. 8(B), a total of four peaks whose gains are higher than a threshold value are obtained. That is, the four peaks include a peak 82 corresponding to a sweep angle θd1, a peak 83 corresponding to a sweep angle θd2, a peak 84 corresponding to a sweep angle θd3, and a peak 86 corresponding to a sweep angle θd4. The system control portion 4 sets a sweep angle θ=θd3 of a peak value, which has the highest gain level of peaks located within a valid range, as the angle with which the Cch audio beam should be output. Subsequently, the system control portion 4 selects and detects how many peaks beyond the threshold value of the gain are present in areas on the opposite sides with respect to the peak 84 set as Cch, excluding peaks too close to the peak set as Cch or peaks corresponding to angles which are impossible as the installation angles of virtual speakers based on common sense. As a result, a total of three peaks 82, 83 and 86 corresponding to sweep angles θ=θd1, θd2 and θd4 are selected. As for the peaks other than the peak 84 set as Cch, the number of peaks on one side with respect to the peak 84 is not the same as the number of peaks on the other side. If the peaks are assigned to the output angles of audio beams respectively by the speaker array apparatus 1, surround-sound will be off balance in the listening position. To solve this problem, in the speaker array apparatus 1, the listening position is changed, or the contents to prompt the user to change the configuration of the audio beams are displayed on the display portion 7.

As the contents to prompt the user to change the configuration, for example, the speaker array apparatus 1 makes the display portion 7 display an instruction to select a setting mode to stereophonically reproduce all the channels or to reproduce Lch and Rch as stereophonic sounds and reproduce SLch and SRch as surround-sounds.

When the user changes the configuration in accordance with this instruction so as to select the setting mode to reproduce Lch and Rch as stereophonic sounds and reproduce SLch and SRch as surround-sounds, setting is done so that the sweep angles θ=θd1 and θd4, which are located substantially symmetrically with respect to the peak 84 set as Cch, are assigned to SLch and SRch, and Lch and Rch are reproduced stereophonically as sounds of the front channels.

The speaker array apparatus 1 may be set in an automatically determination mode. When the number of peaks on one side with respect to the peak set as Cch is not the same as the number of peaks on the other side, the configuration is changed automatically. That is, setting is done so that the sweep angles θ=θd1 and θd4, which are located substantially symmetrically with respect to the peak 84 set as Cch, are assigned to SLch and SRch, and Lch and Rch are stereophonically reproduced as sounds of the front channels, as described above.

When an audio sound or the like is input from the outside, the speaker array apparatus 1 outputs, to the user U, the Cch, Lch and Rch sounds as direct sounds, the SLch sound as a reflected sound reflected once by the left wall 77, and the SRch sound as a reflected sound reflected once by the left wall 81, as shown in FIG. 8(C). Thus, the user U can reproduce surround-sound properly even in the room 75 whose shape is not ideal.

Figure 9:
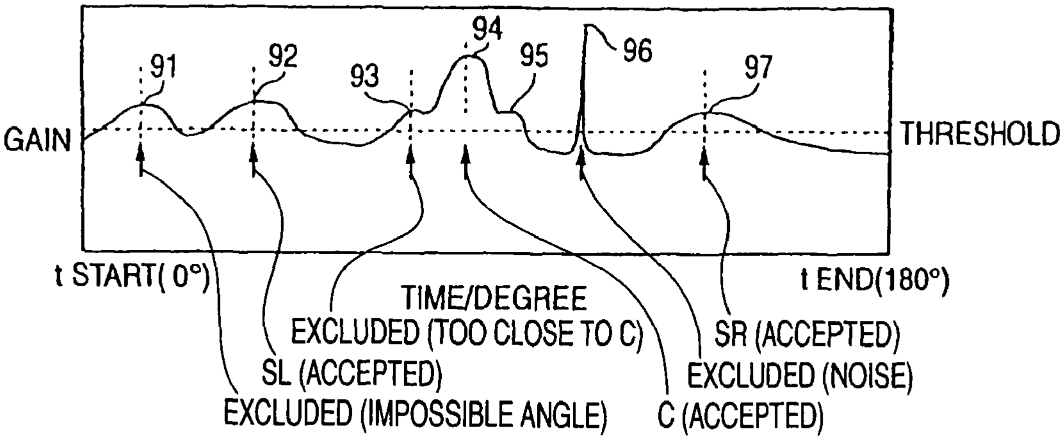
FIG. 9A A graph showing an example of data collected in an audio beam setting mode by the speaker array apparatus.
FIG. 9B A graph showing an example of data collected in the audio beam setting mode by the speaker array apparatus.
FIG. 9C A graph showing an example of data collected in the audio beam setting mode by the speaker array apparatus.
FIG. 9D A graph showing an example of data collected in the audio beam setting mode by the speaker array apparatus.
FIG. 9E A graph showing an example of data collected in the audio beam setting mode by the speaker array apparatus.
Figure 9:
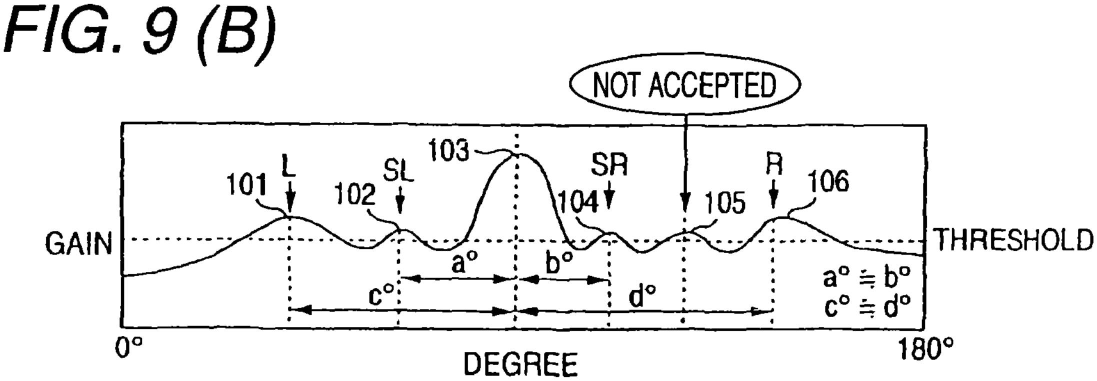
Figure 9:
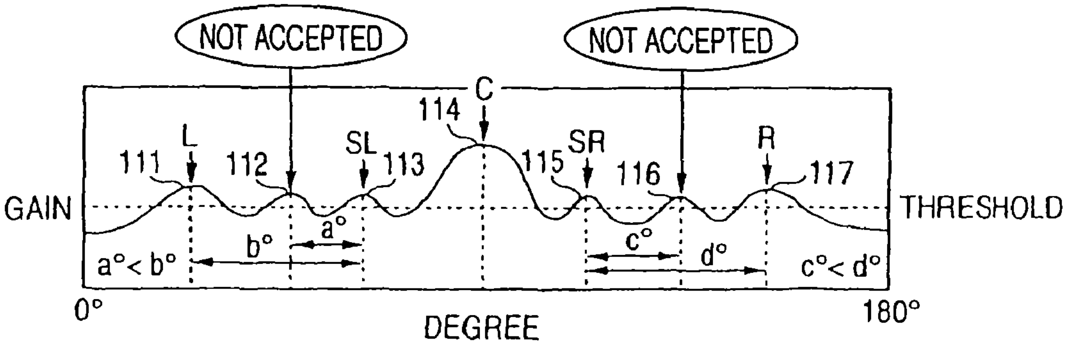
Figure 9:
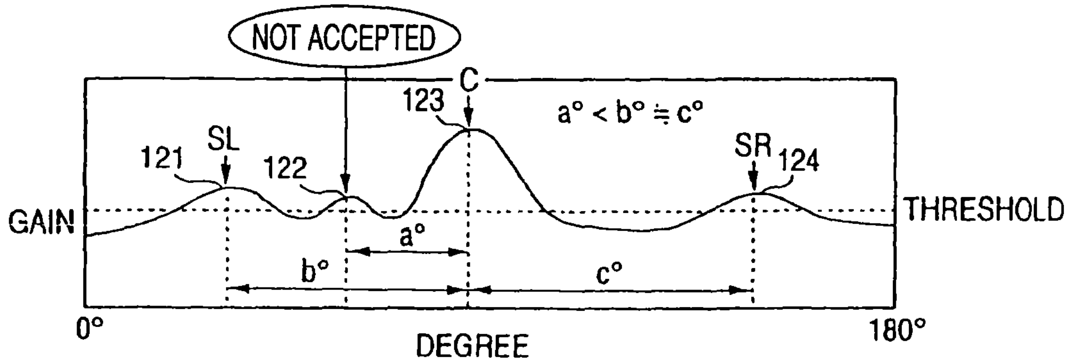
Figure 9:
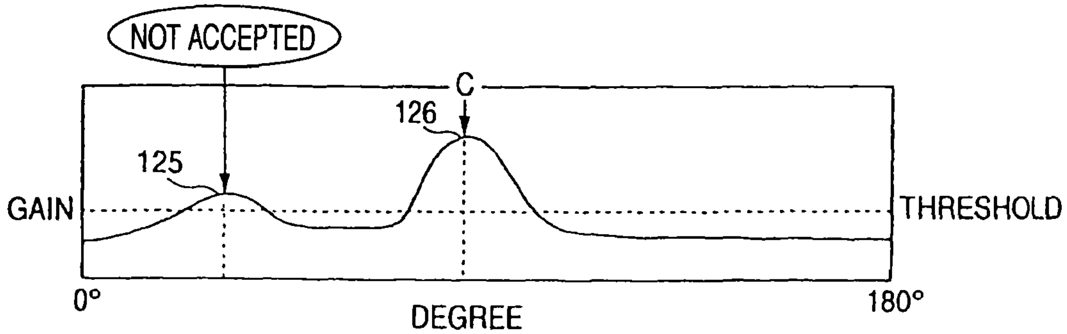

FIG. 9 are graphs showing examples of data collected in the audio beam setting mode by the speaker array apparatus. There may be a case where the room where the speaker array apparatus 1 is installed is not ideal. Even if the room has an ideal shape, there may be a case where the number of peaks higher than the threshold value is larger or smaller than the required number of channels in some layout of furniture. For example, assume that when the speaker array apparatus 1 is installed in a room, the audio beam setting mode is carried out to sweep with audio beams, with the result that data shown in FIG. 9(A) are obtained. In this case, the system control portion 4 of the speaker array apparatus 1 selects a peak value whose gain level is the highest of peaks located within a valid range as described above. In the data shown in FIG. 9(A), the gain level of a peak 96 is the highest, but the waveform thereof is pulsed and has a width not larger than a constant value. Such a waveform is impossible as an audio beam. Thus, the peak 96 is excluded as noise. The system control portion 4 sets a peak 94 having the highest gain level apart from the peak 96, as the angle with which the Cch audio beam should be output. Subsequently, the system control portion 4 selects and detects how many peaks beyond the threshold value of the gain are present in areas on the opposite sides with respect to the peak set as Cch. In this event, peaks 93 and 95 too close to the peak 94 set as Cch are excluded because the beam may overlap the user so that the localization can be set at the speaker direction. A peak 91 corresponds to the case where the user is located just near the speaker. The peak 91 is impossible in normal use. The angle of the peak 91 is also an unrecommendable set angle. Thus, the peak 91 is excluded. As a result, the system control portion 4 assigns peaks 92 and 97 as the angles with which SLch and SRch audio beams should be output.

Assume that the audio beam setting mode is carried out, with the result that data shown in FIG. 9(B) are acquired. In this case, the system control portion 4 of the speaker array apparatus 1 sets a peak 103, which is a peak having the highest gain level of peaks located within a valid range, as the angle with which the Cch audio beam should be output. Subsequently, the system control portion 4 selects and detects how many peaks beyond the threshold value of the gain are present in areas on the opposite sides with respect to the peak set as Cch. In the case of the data shown in FIG. 9(B), two peaks are on one side with respect to the peak 103 set as Cch, and three peaks are on the other side. Therefore, symmetry need be considered. In this event, the difference in angle between the peak 103 and a peak 101 is substantially equal to that between the peak 103 and a peak 106, and the difference in angle between the peak 103 and a peak 102 is substantially equal to that between the peak 103 and a peak 104. Therefore, a peak 105 is excluded, and the peak 101, the peak 102, the peak 104 and the peak 106 are set as the output angles of the Lch, SLch, SRch and Rch audio beams respectively.

Assume that the audio beam setting mode is carried out, with the result that data shown in FIG. 9(C) are acquired. In this case, the system control portion 4 of the speaker array apparatus 1 sets a peak 114, which is a peak having the highest gain level of peaks located within a valid range, as the output angle of Cch. Subsequently, the system control portion 4 selects and detects how many peaks beyond the threshold value of the gain are present in areas on the opposite sides with respect to the peak set as Cch. In the case of the data shown in FIG. 9(C), the number of peaks on one side with respect to the peak 114 set as Cch is the same as the number of peaks on the other side. That is, three peaks are on one side and three peaks are on the other side. Therefore, peaks located within a valid range are selected. Adjacent peaks 113 and 115 on both sides of the peak 114 set as Cch are valid peaks, and correspond to substantially symmetric angles with respect to the peak 114. Accordingly, the peak 113 and the peak 115 are set as the angles with which SLch and SRch should be output, respectively, by the system control portion 4. When there are a plurality of peaks, the system control portion 4 can do setting so that peaks located within a valid range and having as large a distance from the peaks assigned to the rear surround-sounds as possible are assigned to the front channels. Thus, peaks 112 and 116 are not used, but a peak 111 is set as the output angle of Lch, and a peak 117 is set as the output angle of Rch.

Assume that the audio beam setting mode is carried out, with the result that data shown in FIG. 9(D) are acquired. In this case, the system control portion 4 of the speaker array apparatus 1 sets a peak 123, which is a peak having the highest gain level of peaks located within a valid range, as the output angle of Cch. Subsequently, the system control portion 4 selects and detects how many peaks beyond the threshold value of the gain are present in areas on the opposite sides with respect to the peak set as Cch. In the case of the data shown in FIG. 9(D), one peak is on one side with respect to the peak 123 set as Cch, and two peaks are on the other side. Therefore, symmetry need be considered. In this event, the difference in angle between the peak 123 and a peak 121 is substantially equal to that between the peak 123 and a peak 124. Therefore, a peak 122 is excluded, and the peak 121 and the peak 124 are set as the output angles of SLch and Rch respectively. Lch and Rch are set to be reproduced as stereo sounds.

Assume that the audio beam setting mode is carried out, with the result that data shown in FIG. 9(E) are acquired. In this case, the system control portion 4 of the speaker array apparatus 1 sets a peak 126, which is a peak having the highest gain level of peaks located within a valid range, as the output angle of Cch. Subsequently, the system control portion 4 selects and detects how many peaks beyond the threshold value of the gain are present in areas on the opposite sides with respect to the peak set as Cch. In the case of the data shown in FIG. 9(E), one peak is on one side with respect to the peak 123 set as Cch, while no peak is on the other side. Therefore, there is no symmetry. For that reason, the system control portion 4 sets Lch and Rch as direct sounds so as to reproduce them as stereophonic sounds, or sets Cch as a direct sound so as to reproduce it as a monaural sound.

Figure 10:
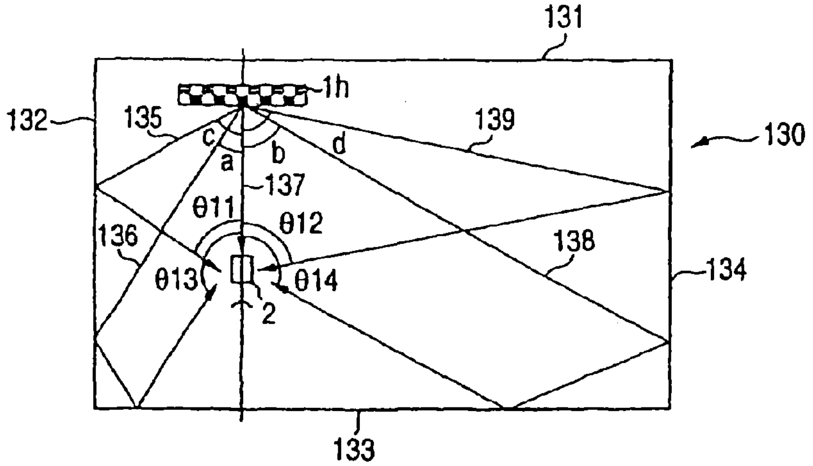
FIG. 10 Diagrams for explaining the operation for installing the speaker array apparatus.
Figure 10:
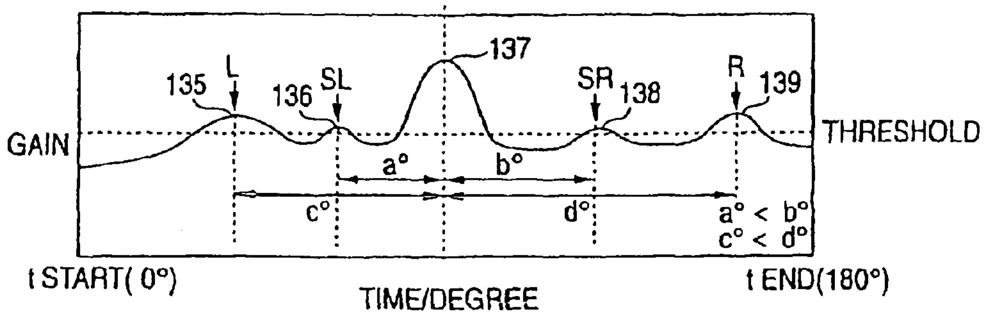
Figure 10:
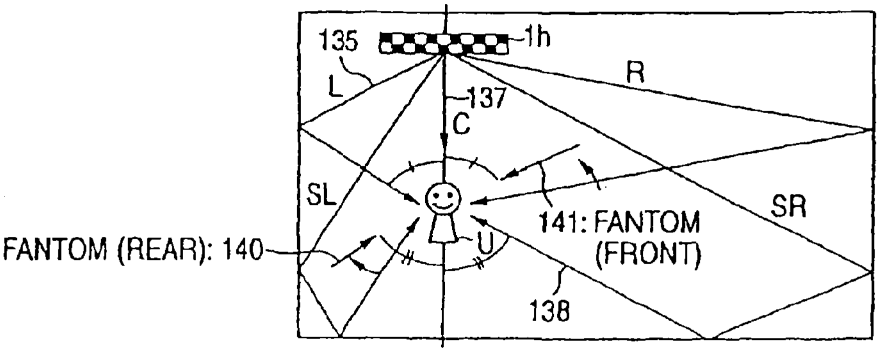

Next, description will be made about the case where the speaker array apparatus 1 forms a phantom based on the result of measuring in the audio beam setting mode. FIG. 10 are diagrams for explaining the operation for installing the speaker array apparatus: (A) is a top view showing the operation for measuring audio beams when the speaker array apparatus is installed near the left of the front wall of a room having a rectangular parallelepiped shape; (B) is a graph showing measured data; and (C) is a top view of the rectangular parallelepiped room after the speaker array apparatus has been installed.

As shown in FIG. 10, when the body 1*h* of the speaker array apparatus 1 is installed near the left of a front wall 131 with respect to the center portion thereof in a rectangular parallelepiped room 130 which is a room having an ideal shape, the user places the microphone 2 in a listening position of surround-sound, and sets the audio beam setting mode to collect audio data. The system control portion 4 sets a sweep angle of a peak 137, which has the highest gain level of peaks located within a valid range, as the output angle of Cch.

Subsequently, the system control portion 4 selects and detects how many peaks beyond the threshold value of the gain are present in areas on the opposite sides with respect to the peak set as Cch. In the case of data shown in FIG. 100(B), two peaks are present on each of the opposite sides with respect to the peak 137 set as Cch. Of them, peaks located within a valid range are selected. The system control portion 4 determines whether each peak 135, 136, 138, 139 other than the peak 137 set as Cch has a valid angle or not, and whether the peaks are symmetric or not.

The system control portion 4 uses the following expressions to determine the symmetry of the peaks. That is, whether Δfront and Δsurround are larger than a predetermined threshold value or not is determined by arithmetic operation using:

$$\Delta front = angle(front L) - \{180° - angle(front R)\} \quad \text{(Expression 1)}$$

$$\Delta surround = angle(surround L) - \{180° - angle(surround R)\} \quad \text{(Expression 2)}$$

In the case of the data shown in FIG. 10(B), Δfront and Δsurround are values larger than the predetermined threshold value. Therefore, the system control portion 4 performs processing for forming a phantom sound source. The system control portion 4 of the speaker array apparatus 1 is designed so that the phantom sound source is formed in a position symmetrical to, of audio beams reaching the listener, an audio beam having a smaller angle with respect to an audio beam set as Cch.

For example, in the case of the audio beams shown in FIG. 10(A), a phantom sound source is formed in accordance with a smaller angle of an angle θ11 between the peak 135 corresponding to Lch and the peak 137 set as Cch and an angle θ12 between the peak 139 corresponding to Rch and the peak 137 set as Cch. That is, the system control portion 4 compares the angle c between the peak 137 set as Cch and the peak 135 with the angle d between the peak 137 and the peak 139 based on the data shown in FIG. 10(B), and selects the smaller angle θc.

In addition, a phantom sound source is formed in accordance with a smaller angle of an angle θ13 between the peak 136 corresponding to SLch and the peak 137 set as Cch and an angle θ14 between the peak 138 corresponding to SRch and the peak 137 set as Cch. That is, the system control portion 4 compares the angle a between the peak 137 set as Cch and the peak 136 adjacent thereto with the angle θb between the peak 137 and the peak 138 based on the data shown in FIG. 10(B), and selects the larger angle θb.

Assume that both the front sounds and the surround-sounds are formed out of audio beams. As for the front sounds, in this case, the system control portion 4 outputs a sound source position correction signal to the phantom formation portion 8 so as to form a phantom sound source for Lch out of Cch and Lch and form a phantom sound source for Rch out of Cch and Rch. As for the surround-sounds, the system control portion 4 outputs a sound source position correction signal to the phantom formation portion 8 so as to form a phantom sound source for SLch out of Lch and SLch and form a phantom sound source for SRch out of Rch and SRch.

On the other hand, assume that only the surround-sounds are formed out of audio beams. In this case, as for the surround-sounds, the system control portion 4 outputs a sound source position correction signal to the phantom formation portion 8 so as to form a phantom sound source for SLch out of Cch and SLch and form a phantom sound source for SRch out of Cch and SRch.

Accordingly, in the case of the data shown in FIG. 10(B), the system control portion 4 forms Lch and Rch as surround-sounds out of the audio beams 135 and 138, and forms phantoms 140 and 141 for SLch and SRch as shown in FIG. 10(C). Thus, even when the listening position of the user is not in the center of the room 130 but asymmetric, the user can enjoy listening surround-sound reproduced properly.

After automatic control for performing setting thus, the speaker array apparatus 1 prompts the user U to confirm the setting through a test tone. If there is no problem, optimum surround-sound can be further provided to the user U by automatic adjustment sequences such as level adjustment of each channel, frequency characteristic adjustment, time alignment adjustment, etc.

Figure 11:
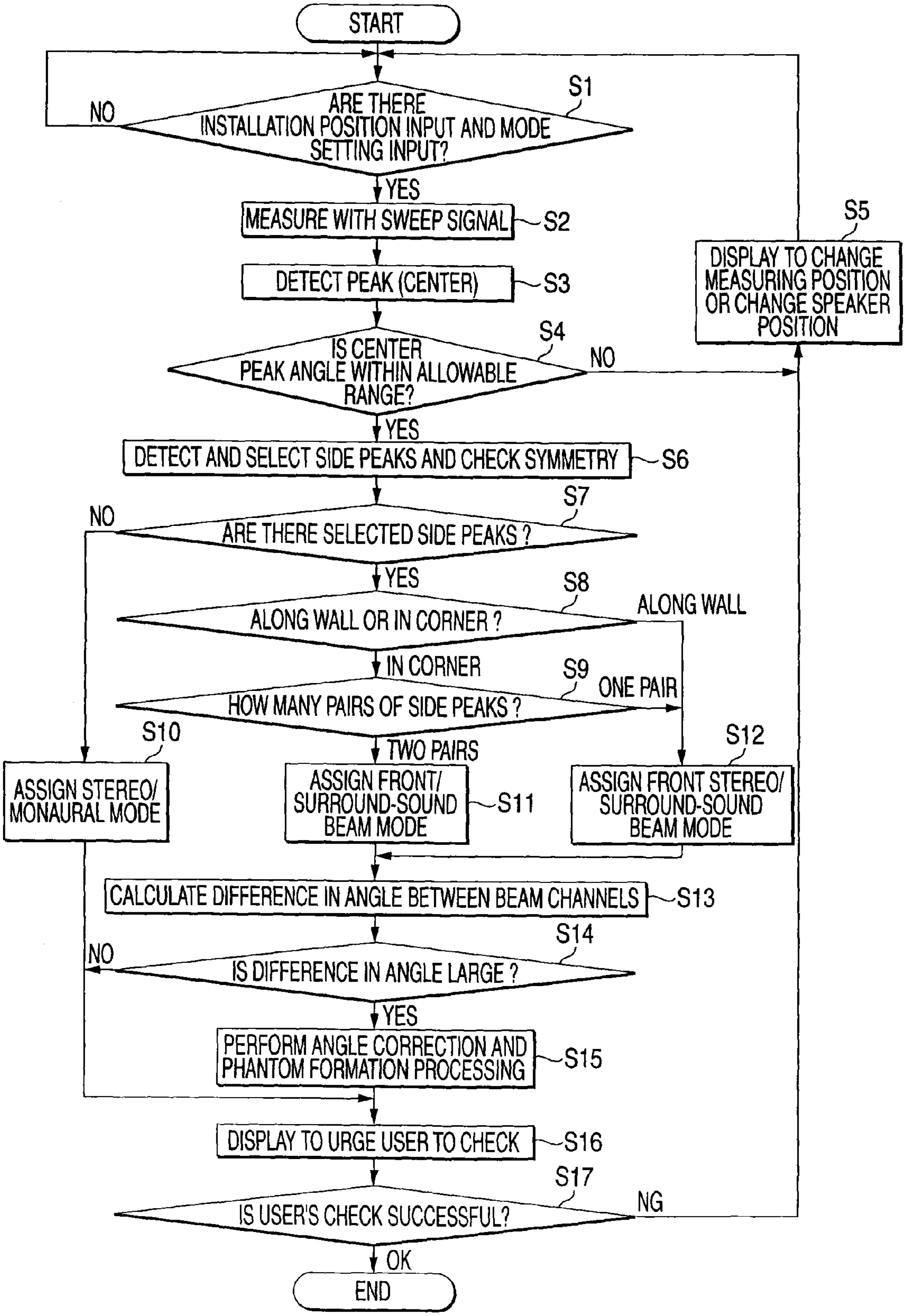
FIG. 11 A flow chart for explaining the operation when the speaker array apparatus carries out the audio beam setting mode.
Figure 12:
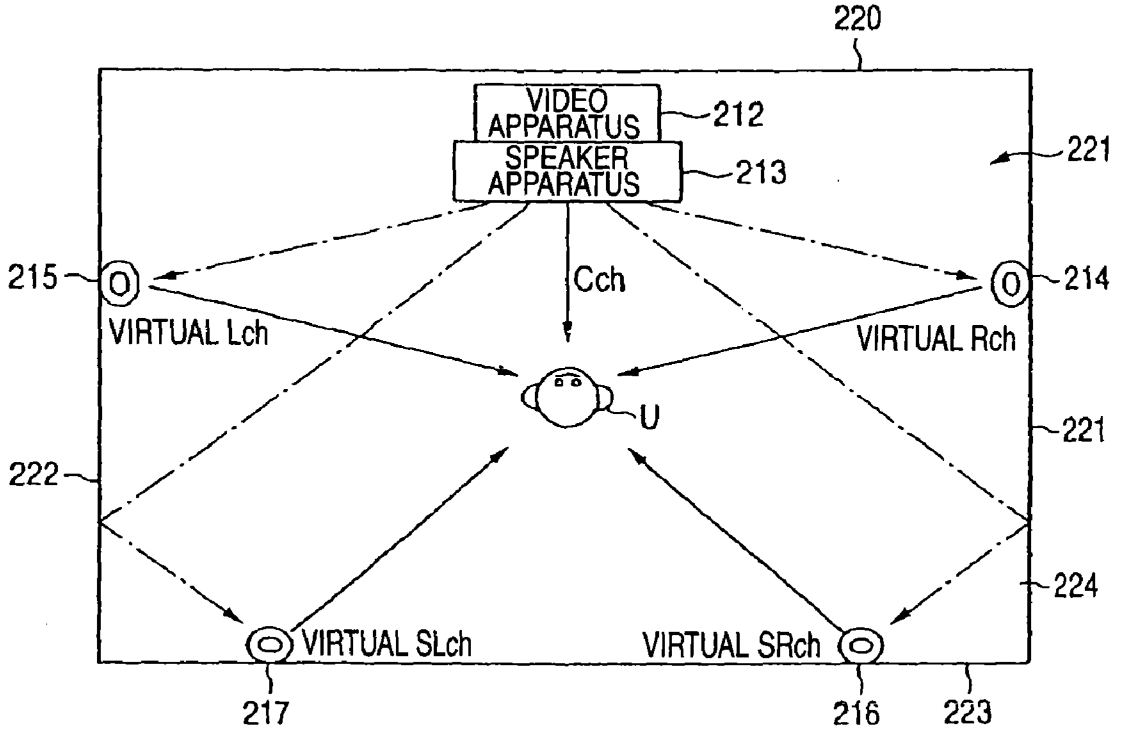
FIG. 12 A top perspective view of a room where a speaker apparatus disclosed in Patent Document 1 is installed. Incidentally, the reference numerals in the drawings designate parts as: 1, a speaker array apparatus; 2, a microphone; 3, a converter; 4, a system control portion; 5, a storage portion; 6, an operating portion; 7, a display portion; 8, a phantom formation portion; 9, a beam formation portion; and 10, a speaker array.

Next, the operation with which the speaker array apparatus 1 carries out the audio beam setting mode will be described with reference to a flow chart. FIG. 11 is a flow chart for explaining the operation with which the speaker array apparatus carries out the audio beam setting mode.

The user U installs the body 1*h* of the speaker array apparatus 1 in a desired position of the room, and places the microphone 2 in the listening position. The user U operates the operating portion 6 of the body 1*h* to input the installation position (in a corner or along a wall) of the speaker array apparatus 1 in the room, and then starts the audio beam setting mode.

When the system control portion 4 of the speaker array apparatus 1 detects the input for starting the audio beam setting mode after the input of the installation position of the speaker array apparatus 1 due to the operation of the operating portion 6 (s1), the system control portion 4 forms a sweep signal and outputs the sweep signal to the beam formation portion 9. Thus, a beam signal formed by the beam formation portion 9 is supplied to the speaker array 10 so as to sweep the range from the 0-degree direction to the 180-degree direction with the sweep signal. Sounds reflected by the walls of the room and direct sounds output from the speaker array 10 are collected by the microphone 2. The collected sound data are converted into digital audio signals by the A/D converter 3, and accumulated in the storage 5 (s2).

When the system control portion 4 terminates the sweep operation, the signals are output to make the system control portion 4 start to analyze the audio signals. That is, the system control portion 4 reads the audio data from the storage portion 5, analyzes the audio data and sets a sweep angle of a peak value, which has the highest gain level of peaks located within a valid range, for Cch (s3). The system control portion 4 determines whether the sweep angle set for Cch is within an allowable range (not larger than a predetermined angle) or not (s4). When the sweep angle set for Cch is not within the allowable range, the system control portion 4 changes the listening position where the microphone 2 has been placed, or makes the display portion 7 display contents to prompt the user to change the installation position of the speaker array 1 (s5). The system control portion 4 stands by until the user changes the position in accordance with the instruction and operation of the operating portion 6 again is detected (s1).

On the other hand, in Step s4, the system control portion 4 checks, selects and detects how many peaks (side peaks) beyond the threshold value of the gain are present in areas on the opposite sides (temporally in front and behind and angularly left and right) with respect to the peak set as Cch, excluding peaks too close to the peak set as Cch or peaks corresponding to angles which are impossible as the installation angles of virtual speakers based on common sense. In this event, symmetry of the side peaks with respect to Cch is examined (s6).

When side peaks cannot be selected and detected on the opposite sides of the peak set as Cch (s7), the system control portion 4 performs setting to reproduce direct sounds from the speaker array 10 to the listening position in a stereo mode or a monaural mode (s10). The system control portion 4 makes the display portion 7 display contents to prompt the user to perform checking to confirm the settings of sound output from the speaker array apparatus 1 (s16).

On the other hand, when a plurality of side peaks on the opposite sides of the peak set as Cch can be selected and detected in Step s7, the system control portion 4 confirms the installation position of the speaker array apparatus 1. When the installation position is along a wall (s8), the system control portion 4 confirms the number of side peaks on the opposite sides of the peak set as Cch (s9). When two peaks are present on each of the opposite sides with respect to the Cch, channels are assigned to the peaks respectively so that both the front sounds and the surround-sounds are output as audio beams (s11). Subsequently, the system control portion 4 calculates angle differences between the channels of the beam sounds assigned to the surround-sounds by use of the aforementioned expressions 1 and 2 (s13).

When the installation position of the speaker array apparatus 1 is a corner in the room in Step s8 (s8), and when one peak is present on each of the opposite sides with respect to the Cch in Step s9, the peaks are assigned to the surround-sounds so as to reproduce the surround-sounds as audio beams, while the front sounds are set for stereophonic reproduction (s12). Then, processing of Step s13 is performed.

When the processing of Step s13 is completed, the system control portion 4 determines whether the difference in angle between the beam sound channels assigned to the surround-sounds is larger than a threshold value or not (s14). When the difference in angle is larger than the threshold value, the system control portion 4 performs angle correction and performs processing for forming a phantom sound source (s15). When Step s15 is terminated or when the difference in angle is not larger than the threshold value in Step s14, the system control portion 4 makes the display portion 7 display contents to prompt the user to perform checking to confirm the settings of the surround-sounds, and waits for an input from the operating portion 6 (s17).

When the result accepted by the operating portion 6 is OK, the system control portion 4 holds the settings and terminates the processing. On the other hand, when the result accepted by the operating portion 6 is NG in Step s17, the system control portion 4 carries out the processing of Step s5.

In the aforementioned manner, according to the present invention, setting of audio beams which has been difficult in a background-art speaker array apparatus can be performed easily and quickly. In addition, the setting is superior in affinity to automatic level, quality and distance correction techniques. According to the present invention, a series of audio beam settings can be performed by automatic measuring.

Although the present invention has been drawn and illustrated based on its specific preferred embodiment, it is obvious to those skilled in the art that various changes or modifications can be made on the invention without departing from its spirit, scope or purpose.

This application is based on Japanese Patent Application No. 2004-185364 filed on Jun. 23, 2004, the contents of which are incorporated herein by reference.

INDUSTRIAL APPLICABILITY

When a speaker array apparatus according to the present invention is installed in a room, a microphone is placed in a position where a user will listen, and a test sound is output from a speaker array so that audio beams are automatically turned (swept). In this event, the audio beams are collected by the microphone so that sounds output from the speaker array directly to the microphone and sounds reflected from walls of the room to the microphone can be detected as peaks of a signal level. By this, in order to reproduce an optimum surround-sound in the listening position, the positions of the walls of the room where the audio beams output from the array speaker should be reflected so that a multi-channel audio signal can be reproduced optimally can be detected easily in a short time. When the sweep angles with which the peaks were detected are set as angles with which audio beams of respective channels in a multi-channel audio signal should be output, the user can easily perform setting to reproduce the multi-channel surround-sound after the installation of the speaker array apparatus regardless of the shape of the room where the speaker array apparatus is installed, the layout of furniture, or the like.

The invention claimed is:

1. A speaker array apparatus comprising:

a speaker array that has a plurality of speakers for outputting audio beams based on a test audio signal;

a test sound sweep portion that sweeps with the audio beams;

a microphone that is placed in a listening position and collects a test sound including direct sounds and reflected sounds of the audio beams output from the speaker array;

a storage portion that stores a signal level of the test sound collected by the microphone, and sweep angles with which audio beams corresponding to the test sound are output;

a selection portion that selects a plurality of peaks of the signal level based on the signal level of the test sound stored in the storage portion; and a beam setting portion that sets the sweep angles of the selected plurality of peaks as beam output angles which are angles to output audio beams of channels of a multi-channel surround-sound respectively;

wherein the beam setting portion sets a sweep angle of a peak where the signal level of the test sound is the highest as a beam output angle of a center channel of the multi-channel surround-sound.

2. A speaker array apparatus comprising:

a speaker array that has a plurality of speakers for outputting audio beams based on a test audio signal;

a test sound sweep portion that sweeps with the audio beams;

a microphone that is placed in a listening position and collects a test sound including direct sounds and reflected sounds of the audio beams output from the speaker array;

a storage portion that stores a signal level of the test sound collected by the microphone, and sweep angles with which audio beams corresponding to the test sound are output;

a selection portion that selects a plurality of peaks of the signal level based on the signal level of the test sound stored in the storage portion; and a beam setting portion that sets the sweep angles of the selected plurality of peaks as beam output angles which are angles to output audio beams of channels of a multi-channel surround-sound respectively;

wherein when the number of peaks selected from the signal level of the test sound stored in the storage portion is smaller than the number of channels of the multi-channel surround-sound, the beam setting portion sets the sweep angles of the selected peaks as beam output angles of one or more channels of the multi-channel surround-sound, and sets sounds of channels other than the channels for which the beam output angles are set, as direct sounds to be output to be propagated directly to the listening position.

3. The speaker array apparatus according to claim 1, further comprising an information portion that provides at least information to prompt the user to change the listening position or to prompt the user to change a sound reproduction method when the beam output angle of the center channel of the multi-channel surround-sound set by the beam setting portion is shifted from a direction perpendicular to a front surface of the speaker array by an angle greater or equal to a predetermined angle.

4. The speaker array apparatus according to claim 1, wherein when the output angles set for the channels respectively are asymmetric with respect to the beam output angle of the center channel, the beam setting portion forms a signal localization of one of the channels as a phantom using audio beams directed in a plurality of directions so as to form a symmetric sound field.

5. A speaker array apparatus comprising:

a speaker array that has a plurality of speakers for outputting audio beams based on a test audio signal;

a test sound sweep portion that sweeps with the audio beams;

a microphone that is placed in a listening position and collects a test sound including direct sounds and reflected sounds of the audio beams output from the speaker array;

a storage portion that stores a signal level of the test sound collected by the microphone, and sweep angles with which audio beams corresponding to the test sound are output;

a selection portion that selects a plurality of peaks of the signal level based on the signal level of the test sound stored in the storage portion;

a beam setting portion that sets the sweep angles of the selected plurality of peaks as beam output angles which are angles to output audio beams of channels of a multi-channel surround-sound respectively; and an input portion that accepts an input of installation position information of a body of the speaker array apparatus;

wherein the beam setting portion selects a plurality of peaks from the signal level of the test sound stored in the storage portion based on the installation position information of the body.

6. A speaker array apparatus comprising:

a speaker array that has a plurality of speakers for outputting audio beams based on a test audio signal;

a test sound sweep portion that sweeps with the audio beams;

a microphone that is placed in a listening position and collects a test sound including direct sounds and reflected sounds of the audio beams output from the speaker array;

a storage portion that stores a signal level of the test sound collected by the microphone, and sweep angles with which audio beams corresponding to the test sound are output;

a selection portion that selects a plurality of peaks of the signal level based on the signal level of the test sound stored in the storage portion; and a beam setting portion that sets the sweep angles of the selected plurality of peaks as beam output angles which are angles to output audio beams of channels of a multichannel surround-sound respectively;

wherein the test sound sweep portion modulates the signal level of the test sound with an envelope having a maximum at the center of a sweep range of the audio beams.

* * * * *